United States Patent
Diaconu

(10) Patent No.: US 9,638,766 B2
(45) Date of Patent: May 2, 2017

(54) MAGNETIC FIELD SENSOR WITH IMPROVED ACCURACY RESULTING FROM A VARIABLE POTENTIOMETER AND A GAIN CIRCUIT

(71) Applicant: ALLEGRO MICROSYSTEMS, LLC, Worcester, MA (US)

(72) Inventor: Aurelian Diaconu, Londonderry, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 344 days.

(21) Appl. No.: 14/551,905

(22) Filed: Nov. 24, 2014

(65) Prior Publication Data

US 2016/0146905 A1 May 26, 2016

(51) Int. Cl.
*G01R 33/07* (2006.01)
*G01R 33/00* (2006.01)

(52) U.S. Cl.
CPC ....... *G01R 33/077* (2013.01); *G01R 33/0017* (2013.01)

(58) Field of Classification Search
CPC .. F02D 41/3854; F02D 41/3082; F02D 41/26; G01R 33/0029; G01R 33/077;
(Continued)

(56) References Cited

U.S. PATENT DOCUMENTS 4,668,914 A   5/1987  Kersten et al.
4,761,569 A   8/1988  Higgs
(Continued)

FOREIGN PATENT DOCUMENTS

DE   10 2005 014 509 B4   10/2006
DE   10 2006 037 226 A1   2/2008
(Continued)

OTHER PUBLICATIONS

Allegro Microsystems, Inc.; "High Precision Linear Hall Effect Sensor IC with a Push/Pull, Pulse Width Modulated Output;" A1351; pp. 1-23.
(Continued)

*Primary Examiner* — Son Le
*Assistant Examiner* — Brent J Andrews
(74) *Attorney, Agent, or Firm* — Daly, Crowley, Mofford & Durkee, LLP

(57) ABSTRACT

A magnetic field sensor includes a plurality of magnetic field sensing elements, wherein the plurality of magnetic field sensing elements is configured to generate a plurality of magnetic field signals, each magnetic field sisal responsive to a magnetic field. The magnetic field sensor additionally includes a sequence switches circuit coupled to the plurality of magnetic field sensing elements. The sequence switches circuit is configured to sequentially select from among the plurality of magnetic field signals to generate a sequenced output signal representative of sequentially selected ones of the plurality of magnetic field signals. The magnetic field sensor also includes a variable potentiometer coupled to the sequence switches circuit. The magnetic field sensor additionally includes a gain circuit coupled to receive a signal representative of the offset attenuated sequenced output signal. A corresponding method is also provided.

33 Claims, 12 Drawing Sheets

(58) Field of Classification Search
CPC .. G01R 33/075; G01R 33/07; G01R 33/0088; G01D 5/145
See application file for complete search history.

(56) References Cited

U.S. PATENT DOCUMENTS

| | | | |
|---|---|---|---|
| 4,829,352 | A | 5/1989 | Popovic et al. |
| 5,541,506 | A | 7/1996 | Kawakita et al. |
| 5,572,058 | A | 11/1996 | Biard |
| 5,612,618 | A | 3/1997 | Arakawa |
| 5,619,137 | A | 4/1997 | Vig et al. |
| 5,621,319 | A | 4/1997 | Bilotti et al. |
| 5,657,189 | A | 8/1997 | Sandhu |
| 5,694,038 | A | 12/1997 | Moody et al. |
| 5,831,513 | A | 11/1998 | Lue |
| 5,844,411 | A | 12/1998 | Vogt |
| 5,942,895 | A | 8/1999 | Popovic et al. |
| 6,064,199 | A | 5/2000 | Walter et al. |
| 6,064,202 | A | 5/2000 | Steiner et al. |
| 6,091,239 | A | 7/2000 | Vig et al. |
| 6,100,680 | A | 8/2000 | Vig et al. |
| 6,166,535 | A | 12/2000 | Irie et al. |
| 6,232,768 | B1 | 5/2001 | Moody et al. |
| 6,236,199 | B1 | 5/2001 | Irle et al. |
| 6,265,864 | B1 | 7/2001 | De Winter et al. |
| 6,288,533 | B1 | 9/2001 | Haeberli et al. |
| 6,297,627 | B1* | 10/2001 | Towne ............ H03G 3/001 324/207.12 |
| 6,356,741 | B1 | 3/2002 | Bilotti et al. |
| 6,525,531 | B2 | 2/2003 | Forrest et al. |
| 6,542,068 | B1 | 4/2003 | Drapp et al. |
| 6,545,462 | B2 | 4/2003 | Schott et al. |
| 6,622,012 | B2 | 9/2003 | Bilotti et al. |
| 6,768,301 | B1 | 7/2004 | Hohe et al. |
| 6,969,988 | B2 | 11/2005 | Kakuta et al. |
| 7,030,606 | B2 | 4/2006 | Kato et al. |
| 7,038,448 | B2 | 5/2006 | Schott et al. |
| 7,085,119 | B2 | 8/2006 | Bilotti et al. |
| 7,119,538 | B2 | 10/2006 | Blossfeld |
| 7,159,556 | B2 | 1/2007 | Yoshihara |
| 7,235,968 | B2 | 6/2007 | Popovic et al. |
| 7,259,556 | B2 | 8/2007 | Popovic et al. |
| 7,307,824 | B2 | 12/2007 | Bilotti et al. |
| 7,362,094 | B2 | 4/2008 | Voisine et al. |
| 7,714,570 | B2 | 5/2010 | Thomas et al. |
| 7,746,065 | B2 | 6/2010 | Pastre et al. |
| 7,759,929 | B2 | 7/2010 | Forsyth |
| 7,872,322 | B2 | 1/2011 | Schott et al. |
| 7,911,203 | B2 | 3/2011 | Thomas et al. |
| 7,965,076 | B2 | 6/2011 | Schott |
| 7,994,774 | B2 | 8/2011 | Thomas et al. |
| 2006/0011999 | A1 | 1/2006 | Schott et al. |
| 2009/0121707 | A1 | 5/2009 | Schott |
| 2009/0174395 | A1 | 7/2009 | Thomas et al. |
| 2010/0156397 | A1 | 6/2010 | Yabusaki et al. |
| 2010/0164491 | A1 | 7/2010 | Kejik et al. |
| 2011/0248708 | A1 | 10/2011 | Thomas et al. |
| 2012/0313635 | A1* | 12/2012 | Daubert ............ G01R 33/077 324/251 |
| 2014/0225598 | A1* | 8/2014 | Romero ............. G01B 7/023 324/207.12 |
| 2015/0253156 | A1 | 9/2015 | Petrie |
| 2015/0316626 | A1 | 11/2015 | Thornton et al. |
| 2015/0338473 | A1* | 11/2015 | Diaconu ........... G01R 33/0029 324/251 |

FOREIGN PATENT DOCUMENTS

| | | |
|---|---|---|
| EP | 0 631 416 B1 | 12/1994 |
| EP | 0 875 733 B1 | 11/1998 |
| EP | 0 916 074 B1 | 5/1999 |
| EP | 2 000 814 A2 | 12/2008 |
| JP | 58-055688 A | 4/1983 |
| JP | 2003-042709 | 2/2003 |
| JP | 2005-241269 | 9/2005 |
| JP | 2010-014607 | 1/2010 |
| JP | 2010-078366 | 4/2010 |
| WO | WO 98/10302 | 3/1998 |
| WO | WO 98/54547 | 12/1998 |
| WO | WO 00/02266 | 1/2000 |
| WO | WO 03/036732 A2 | 5/2003 |
| WO | WO 2004/025742 A1 | 3/2004 |
| WO | WO 2006/056289 A1 | 6/2006 |
| WO | WO 2006/056829 | 6/2006 |
| WO | WO 2006/074989 A2 | 7/2006 |
| WO | WO 2008 145662 A1 | 12/2008 |
| WO | WO 2009/124969 A1 | 10/2009 |

OTHER PUBLICATIONS

Allegro Microsystems, Inc.; "High Precision 2-Wire Linear Hall Effect Sensor IC with a Pulse Width Modulated Output;" A1354; pp. 1-22.

Allegro Microsystems, Inc.; "High Precision Linear Hall-Effect Sensor with an Open Drain Pulse Width Modulated Output;" A1356; pp. 1-20.

Allegro Microsystems, Inc.; "Low-Noise Programmable Linear Hall Effect Sensor ICs with Adjustable Bandwidth (50 kHz Maximum) and Analog Output;" A1360, A1361 and A1362; pp. 1-25.

Baschirotto et al.; "Development and Analysis of a PCB Vector 2-D Magnetic Field Sensor System for Electronic Compasses;" IEEE Sensors Journal, vol. 6, No. 2; Apr. 2006; pp. 365-371.

Kejik, et al.; "Purley CMOS Angular Position Sensor Based on a New Hall Microchip;" 34th Annual Conference of IEEE Industrial Electronics; IECON; Nov. 10-13, 2008; pp. 1777-1781.

Kejik,.et al.; "Ultra Low-Power Angular Position Sensor for High-Speed Portable Applications;" 2009 IEEE Sensors Conference; Oct. 25-28, 2009; pp. 173-176.

Reymond, et al.; "True 2D CMOS Integrated Hall Sensor;" 2007 IEEE Sensors Conference; Oct. 28-31, 2007; pp. 860-863.

Gerhauser; "Intelligente 3D-Magnetfeld Snesorik;" Fraunhofer-Institut for Integrierte Schaltungen IIS; www.iis.fraunhofer.de/asic/analog; Oct. 2009; 2 pages.

Melexis Microelectronic Integrated Systems; MLX90333; "Triaxis 3D-Joystick Position Sensor;" Data Sheet; Mar. 2009; 43 pages.

MEMSIC Corporation; AN-00MM-004; "Electronic Tilt Compensation;" Mar. 2008; 5 pages.

MEMSIC Corporation; AN-00MM-003; "Magnetic Sensor Calibration;" Mar. 2008; 5 pages.

MEMSIC Corporation; AN-00MM-002; "Magnetometer Soldering Methodology;" Jun. 2008; 2 pages.

MEMSIC Corpoation; AN-00MM-001; "Magnetometer Fundamentals;" Jun. 2008; 6 pages.

MEMSIC Corporation; AN-00MM-005; "Magnetic Sensor Placement Guidelines;" Oct. 2008; 2 pages.

MEMSIC Corporation; MMC312xMQ; "Tri-axis Magnetic Sensor, with I²C Interface;" Aug. 14, 2008; 9 pages.

MEMSIC Corporation; MMC314xMS; "Ultra Small 3-axis Magnetic Sensor, with I²C Interface;" Mar. 31, 2010; 8 pages.

Micronas GmbH; "HAL® 3625 Programmable Direct Angle Sensor;" Product Information; Sep. 2009; 2 pages.

Allegro Microsystems, Inc.; "A1140/41/42/43 Data Sheet: Sensitive Two-Wire Chopper-Stabilized Unipolar Hall-Effect Switches;" published Sep. 9, 2004; pp. 1-11.

Allegro Microststems, Inc.; "A1174 Data Sheet: Ultrasensitive Hall Effect Latch with Internally or Externally Controlled Sample and Sleep Periods for Track Ball and Scroll Wheel Applications;" published Jul. 25, 2008; pp. 1-13.

Allegro Microsystems, Inc.; "A1230 Data Sheet: Ultra-Sensitive Dual-Channel Quadrature Hall-Effect Bipolar Switch;" published Mar. 26, 2010; 16 sheets.

Allegro Microsystems, Inc.; "A1351 Data Sheet: High Precision Linear Hall Effect Sensor with a Push/Pull, Pulse Width Modulated Output;" published Mar. 7, 2008; pp. 1-23.

Allegro Microsystems, Inc.; "A1360, A1361 and A1362 Data Sheet: Low-Noise Programmable Linear Hall Effect Sensor with Adjustable Bandwidth (50 kHz Maximum) and Analog Output;" published Mar. 18, 2008; pp. 1-25.

(56) References Cited

OTHER PUBLICATIONS

Allegro Microsystems, Inc.; "A3212 Data Sheet: Micropower, Ultra-Sensitive Hall-Effect Switch;" published Sep. 22, 2004; pp. 1-12.

Allegro Microsystems, Inc.; "ATS675LSE Data Sheet: Self-Calibrating TPOS Speed Sensor Optimized for Automotive Cam Sensing Applications;" published Jul. 11, 2008; pp. 1-13.

Allegro Microsystems, Inc.; "27701-AN Data Sheet: Hall-Effect IC Applications Guide;" Application Information, Rev. 2; http://www.allegromicro.com/en/products/design/hall-effect-sensor-ic-applications-guide/AN27701.pdf; downloaded Sep. 29, 2010; pp. 1-40.

Allegro Microsystems, Inc.; "3235 Data Sheet 27633A, Dual-Output Hall-Effect Switch;" http://www.datasheetcatalog.org/datasheets/90/205047_DS.pdf; downloaded Sep. 29, 2010; 6 sheets.

Allegro Microsystems, Inc.; "A3425 Data Sheet: Dual, Chopper-Stabilized, Ultra-Sensitive Bipolar Hall-Effect Switch;" published Jun. 28, 2002; pp. 1-10.

Atherton et al.; "Sensor Signal Conditioning—an IC Designer's Perspective;" IEEE Electro International; Apr. 26-28, 1991; pp. 129-134.

Austria Microsystems; "AS5040 datasheet; 10-Bit Programmable Magnetic Rotary Encoder;" Revision 1.1; Jan. 2004; pp. 1-20.

Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880.

Blanchard et al.; "Cylindrical Hall Device;" International Electron Devices Meeting; Dec. 8-11, 1996; pp. 541-544.

Burger et al.; "New fully integrated 3-D silicon Hall sensor for precise angular-position measurements;" Sensors and Actuators, A 67; May 1998; pp. 72-76.

Dwyer; "Allegro Microsystems, Inc.; AN296061 Data Sheet: Ring Magnet Speed Sensing for Electronic Power Steering;" published Jul. 21, 2009; pp. 1-4.

Freitas et al.; "Giant magnetoresistive sensors for rotational speed control;" Jorunal of Applied Physics, vol. 85, No. 8; Apr. 15, 1999; pp. 5459-5461.

Gilbert; "Technical Advances in Hall-Effect Sensing;" Allegro Microsystems, Inc. Product Description; May 10, 2008; 7 sheets.

Häberli et al.; "Contactless Angle Measurements by CMOS Magnetic Sensor with On Chip Read-Out Circuit;" The 8$^{th}$ International Conference on Solid-State Sensors and Actuators and Eurosensors IX; Jan. 25-29, 1995; pp. 134-137.

Häberli et al.; "Two-Dimensional Magnetic Microsensor with On-Chip Signal Processing for Contactless Angle Measurement;" IEEE Journal of Solid-State Circuits, vol. 31, No. 12; Dec. 1996; pp. 1902-1907.

Hiligsmann et al.; "Monolithic 360 Degrees Rotary Position Sensor IC;" 2004 IEEE Proceeding of Sensors, vol. 3; Oct. 24-27, 2004; pp. 1137-1142.

Kejik et al.; "Circular Hall Transducer for Angular Position Sensing;" International Solid-State Sensors, Actuators and Microsystems Conference; Transducers; Jun. 2007; pp. 2593-2596.

Lou Law; "Angle Position Sensing with 2-Axis Hall ICs;" Sensors Magazine, vol. 20, No. 3; Mar. 2003; 7 sheets.

Masson et al.; "Multiturn and high precision through-shaft magnetic sensor;" Sensor + Text Conference; Proceedings II; May 2009; pp. 41-46.

Metz et al.; "Contactless Angle Measurement Using Four Hall Devices on Single Chip;"; International Conference on Solid State Sensors and Actuators; Transducers; vol. 1; Jun. 16-19, 1997; pp. 385-388.

Munter; "A Low-offset Spinning-current Hall Plate;" Sensors and Actuators, vol. A21-A23; Jan. 1990; pp. 743-746.

Novotechnik Siedle Group; "How New Angular Positioning Sensor Technology Opens a Broad Range of New Applications;" Vert-X Technology; Dec. 2001; pp. 1-5.

Paranjape et al.; "A CMOS-compatible 2-D vertical Hall magnetic-field sensor using active carrier confinement and post-process micromachining;" The 8$^{th}$ International Conference on Solid-State Sensors and Acutators, Physical vol. 53, Issues 1-3; May 1996; pp. 278-283.

Petoussis et al.; "A Novel Hall Effect Sesnor Using Elaborate Offset Cancellation Method;" Sensors & Transducers Journal, vol. 100, Issue 1; Jan. 2009; pp. 85-91.

Popvic; "Not-plate-like Hall magnetic sensors and their applications;" Sensors and Actuators A: Physical, vol. 85, Issues 1-3; Aug. 2000; pp. 9-17.

Roumenin et al.; "Vertical Hall Effect Devices in the Basis of Smart Silicon Sensors;" IEEE Workshop on Intelligent Data Acquisition and Advanced Computing Systems: Technology and Applications; Sep. 5-7, 2005; pp. 55-58.

Roumenin; "Magnetic sensors continue to advance towards perfection;" Sensors and Actuators A: Physical, vol. 46-47, Issues 1-3; Jan.-Feb. 1995; pp. 273-279.

Schneider et al.; "Temperature Calibration of CMOS Magnetic Vector Probe for Contactless Angle Measurement System;" International Electron Devices Meeting; Dec. 8-11, 1996; pp. 533-536.

SENSIMA technology sa; "CVHD: a new concept of Angular Position Sensor;" Slide Presentation for Allegro Microsystems; Mar. 2009; 17 sheets.

Sentron; AN-101; "Angular position sensing with 2-Axis Hall IC 2SA-10;" Feb. 12, 2004; http://www.diegm.uniud.it/petrella/Azionamenti%20Elettrici%20II/Sensori%20e%20trasduttori/Data%20Sheet%20-%202SA-10.pdf; pp. 1-7.

van der Meer; et al; "CMOS quad spinning-current Hall-sensor system for compass application;" IEEE Proceedings of Sensors, vol. 3; Oct. 24-27, 2004; pp. 1434-1437.

Vogelgesang et al.; Robert Bosch GmbH; "GMR sensors in automotive application;" CS-SNS/ECS Slides Presentation; Mar. 2, 2005; 16 sheets.

Volder; "The CORDIC Trigonometric Computing Technique;" The Institute of Radio Engineers, Inc.; IRE Transactions on Electronic Computers, vol. EC, Issue 3; Sep. 1959; pp. 226-230.

Banjevic; "High Bandwidth CMOS Magnetic Sensors Based on the Miniaturized Circular Vertical Hall Device;" Sep. 2011; 153 pages.

Drljaca, et al.; "Nonlinear Effects in Magnetic Angular Position Sensor With Integrated Flux Concentrator;" Proc. 23$^{rd}$ International Conference on Microelectronics (MIEL 2002); vol. 1; NIS; Yugoslavia; May 12-15, 2002; pp. 223-226.

Melexis MLX 90324; ""Under-the Hood" Triaxis Rotary Position feat. SENT Protocol;" 3901090324 Data Sheet; Dec. 2008; 40 pages.

Petrie; "Circular Vertical Hall Magnetic Field Sensing Element and Method with a Plurality of Continuous Output Signals;" U.S. Appl. No. 13/035,243, filed Feb. 25, 2011; 56 pages.

Kaufmann et al.; "Novel Coupling Concept for Five-Contact Vertical Hall Devices;" IEEE 2011 16$^{th}$ International Solid-State Sensors, Actuators and Microsystems Conference (Transducers); Jun. 5-9, 2011; pp. 2855-2858.

Data Sheet of Allegro Microsystems, LLC for A1331 "Precision, Micro Power Hall-Effect Angle Sensor IC WIth Integrated Turns Counter" 21 pages.

Data Sheet of Allegro Microsystems, LLC for A1332 "Precision Hall Effect Angle Sensor IC With I$^2$C Interface" Dec. 4, 2014, 19 pages.

Ex Parte Quayle dated May 31, 2016 for U.S. Appl. No. 14/282,664, 6 pages.

Response to Ex Parte Quayle dated Jun. 20, 2016 for U.S. Appl. No. 14/282,664, 9 pages.

Notice of Allowance dated Jul. 18, 2016 for U.S. Appl. No. 14/282,664, 5 pages.

Banjevic et al; "2D CMOS Integrated Magnetometer Based on the Miniaturized Circular Vertical Hall Device;" International Solid-State Sensors, Actuators and Microsystems Conference; Transducers; Jun. 21-25, 2009; pp. 877-880, 4 pages.

* cited by examiner

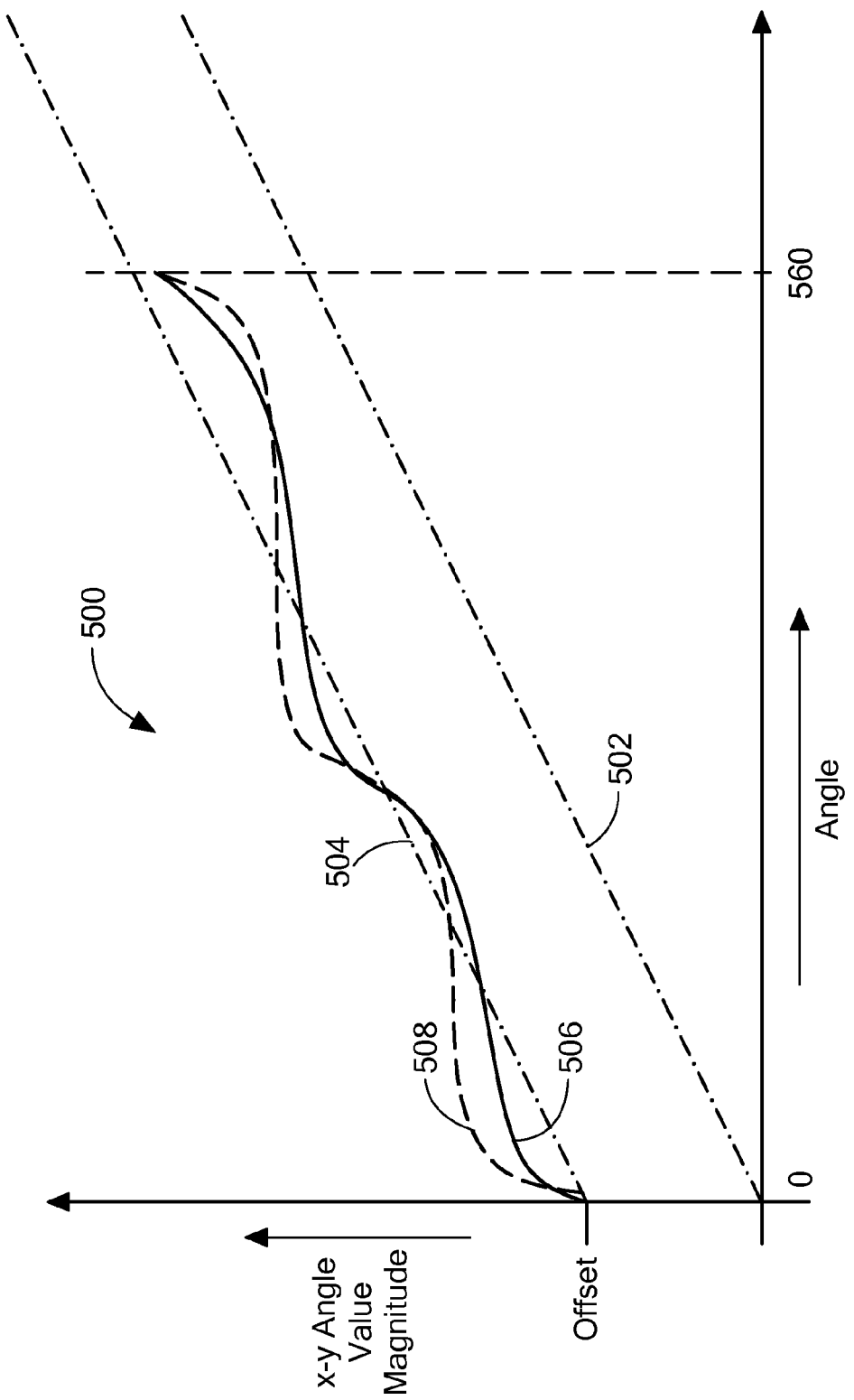

MAGNETIC FIELD SENSOR WITH IMPROVED ACCURACY RESULTING FROM A VARIABLE POTENTIOMETER AND A GAIN CIRCUIT

CROSS REFERENCE TO RELATED APPLICATIONS

Not Applicable.

STATEMENT REGARDING FEDERALLY SPONSORED RESEARCH

Not Applicable.

FIELD OF THE DISCLOSURE

This disclosure relates generally to magnetic field sensors and, more particularly, to a magnetic field sensor that can provide an output signal with improved accuracy that is representative of an angle of rotation and a speed of rotation of a target object.

BACKGROUND OF THE DISCLOSURE

Magnetic field sensing elements can be used in a variety of applications. In one application, a magnetic field sensing element can be used to detect a direction of a magnetic field, i.e., and angle of the direction of the magnetic field. In another application, a magnetic field sensing element can be used to sense an electrical current. One type of current sensor uses a Hall Effect magnetic field sensing element in proximity to a current-carrying conductor.

Planar Hall elements and vertical Hall elements are known types of magnetic field sensing elements. A planar Hall element tends to be responsive to magnetic field perpendicular to a surface of a substrate on which the planar Hall element is formed. A vertical Hall element tends to be responsive to magnetic field parallel to a surface of a substrate on which the vertical Hall element is formed.

Other types of magnetic field sensing elements are known. For example, a so-called "circular vertical Hall" (CVH) sensing element, which includes a plurality of vertical Hall elements, is known and described in PCT Patent Application No. PCT/EP2008056517, entitled "Magnetic Field Sensor for Measuring Direction of a Magnetic Field in a Plane," filed May 28, 2008, and published in the English language as PCT Publication No. WO 2008/145662, which application and publication thereof are incorporated by reference herein in their entirety. The CVH sensing element is a circular arrangement of vertical Hall elements arranged over a common circular implant region in a substrate. The CVH sensing element can be used to sense a direction (i.e., an angle) (and optionally a strength) of a magnetic field in a plane of the substrate.

Various parameters characterize the performance of magnetic field sensing elements and magnetic field sensors that use magnetic field sensing elements. These parameters include sensitivity, which is a change in an output signal of a magnetic field sensing element in response to a change of magnetic field experienced by the magnetic sensing element, and linearity, which is a degree to which the output signal of the magnetic field sensing element varies in direct proportion to the magnetic field. These parameters also include an offset, which is characterized by an output signal from the magnetic field sensing element not representative of a zero magnetic field when the magnetic field sensing element experiences a zero magnetic field.

The above-described CVH sensing element is operable, with associated circuits, to provide an output signal representative of an angle of a direction of a magnetic field. Therefore, as described below, if a magnet is disposed upon or otherwise coupled to a so-called "target object," for example, a camshaft in an engine, the CVH sensing element can be used to provide an output signal representative of an angle of rotation of the target object.

The CVH sensing element provides output signals from a plurality of vertical Hall elements from which it is constructed. Each vertical Hall element can have an undesirable and different DC offset.

The CVH sensing element is but one sensing element that can provide an output signal representative of an angle of a map:talc field, i.e., an angle sensor. For example, an angle sensor can be provided from a plurality of separate vertical Hall elements or a plurality of magnetoresistance elements.

It would be desirable to reduce the DC offsets of a plurality of magnetic field sensing elements (e.g., vertical Hall elements of a CVH sensing element). It would be further desirable to provide an angle sensor with improved accuracy, it would be further desirable to reduce the effect of temperature upon the DC offsets and accuracy. It would be further desirable to provide an angle sensor that does not require a bandpass filter, while still achieving high accuracy.

SUMMARY

The present disclosure is operable to reduce the DC offsets of a plurality of magnetic field sensing elements (e.g., vertical Hall elements of a CVH sensing element). It would be further desirable to provide an angle sensor with improved accuracy. The present disclosure is further operable to reduce the effect of temperature upon the DC offsets and accuracy. The present disclosure is further operable to provide an angle sensor that does not require a bandpass filter, while still achieving high accuracy.

In one aspect, a magnetic field sensor that includes a plurality of magnetic field sensing elements with each of the plurality of magnetic field sensing elements having a respective plurality of contacts. The plurality of magnetic field sensing elements is configured to generate a plurality of magnetic field signals with each magnetic field signal responsive to a magnetic field. The magnetic field sensor further includes a sequence switches circuit coupled to the plurality of magnetic field sensing elements. The sequence switches circuit is coupled to receive a control signal and, in response to the control signal, the sequence switches circuit is configured to sequentially select from among the plurality of magnetic field sensing elements to generate a sequenced output signal representative of sequentially selected ones of the plurality of magnetic field signals. Additionally, the magnetic field sensor includes a memory device configured to store a plurality of potentiometer control values. The magnetic field sensor also includes a variable potentiometer coupled to the sequence switches circuit. The variable potentiometer is configured to attenuate the sequenced output signal by a plurality of attenuation factors responsive to one or more of the plurality of potentiometer control values. Each one of the plurality of attenuation factors is related to a respective error voltage of a respective one of the plurality of magnetic field signals. The magnetic field sensor also includes a gain circuit coupled to receive a signal representative of the attenuated sequenced output signal without filtering. The gain circuit has a gain selected such that the gain circuit is configured to generate a clamped sequenced output signal having a predetermined number of samples between clamping levels of the gain circuit. The predetermined number is substantially less than half a number of the plurality of magnetic field sensing elements in the magnetic field sensor.

In another aspect, a method includes generating a plurality of magnetic field signals with a plurality of magnetic field sensing elements. Each one of the plurality of magnetic field sensing elements has a respective plurality of contacts with each magnetic field signal being responsive to a magnetic field. The method further includes sequentially selecting from among the plurality of magnetic field sensing elements, in response to a control signal, to generate a sequenced output signal representative of sequentially selected ones of the plurality of magnetic field signals. The method, also includes storing, in a memory device, a plurality of potentiometer control values. Additionally, the method includes attenuating the sequenced output signal by a plurality of attenuation factors responsive to one or more of the plurality of potentiometer control values. Each one of the plurality of attenuation factors is related to a respective error voltage of a respective one of the plurality of magnetic field signals. Moreover, the method includes generating a clamped sequenced output signal from a signal representative of the offset attenuated sequenced output signal. The clamped sequenced output signal has a predetermined number of samples between clamping levels of a gain circuit configured to generate the clamped sequenced output signal. The predetermined number is substantially less than half a number of the plurality of magnetic field sensing elements in the magnetic field sensor.

BRIEF DESCRIPTION OF THE DRAWINGS

The foregoing features of the disclosure, as well as the disclosure itself may be more carefully understood from the following detailed description of the drawings, which:

FIG. 5 is a graph showing ideal and non-ideal operation of the magnetic field sensor of FIG. 3;

DETAILED DESCRIPTION

Figure 1:
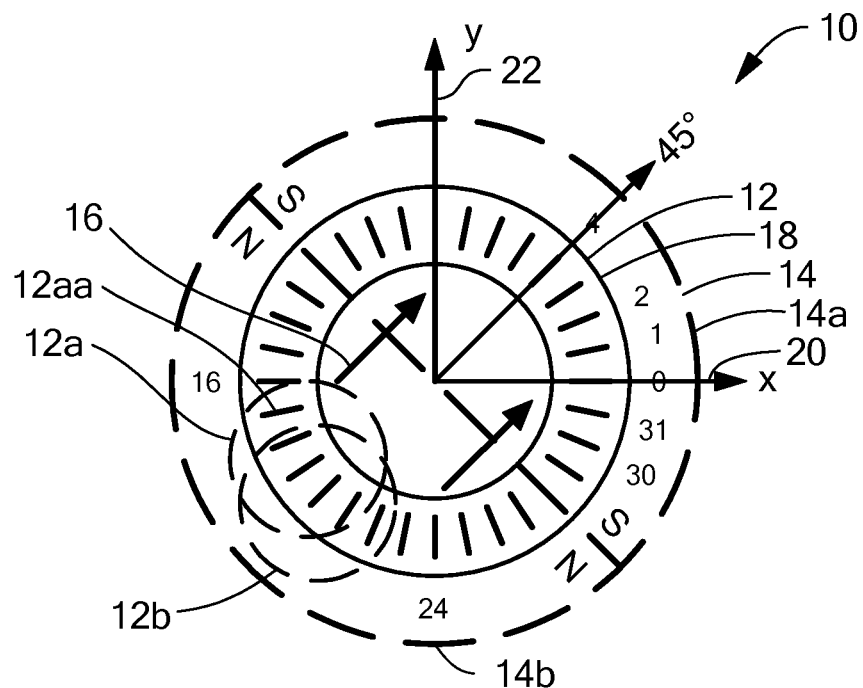
FIG. 1 is a pictorial showing a circular vertical Hall (CVH) sensing element having a plurality of vertical Hall elements arranged in a circle over a common implant region upon a substrate, and a two pole magnet disposed close to the CVH sensing element.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an isotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the terra "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "potentiometer" is used to describe an electronic element that provides a variable resistor divider and can include, but is not limited to, manually adjustable potentiometers, digitally adjustable potentiometers, variable resistors, or a combination thereof.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ARC), which can be an analog ASIC or a digital ASIC, in some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While a circular vertical Hall (CVH) element, which has a plurality of vertical Hall elements, is described in examples below, it should be appreciated that the same or similar techniques and circuits apply to any type of magnetic field sensing element(s) arranged in a manner to detect an angle of a pointing direction of a magnetic field, i.e., a rotation angle of a target object to which a magnet is attached.

Referring to FIG. 1, a circular vertical Hall (CVH) element 12 includes a circular implant and diffusion region 18 in a substrate (not shown). The CVH sensing element 12 has a plurality of vertical Hall elements, of which a vertical Hall element 12a is but one example. In some embodiments, the common implant and diffusion region 18 can be characterized as a common epitaxial region upon a substrate, bounded by semiconductor isolation structures.

Each vertical Hall element has a plurality of Hall element contacts (e.g., four or five contacts), e.g., 12aa. Each vertical Hall element contact can be comprised of a metal contact over a contact diffusion region (a pickup) diffused into the common implant and diffusion region 18.

A particular vertical Hall element (e.g., 12a) within the CM sensing element 12, which, for example, can have five adjacent contacts, can share some, for example, four, of the five contacts with a next vertical Hall element (e.g., 12b). Thus, a next vertical Hall element can be shifted by one contact from a prior vertical Hall element. For such shifts by one contact, it will be understood that the number of vertical Hall elements is equal to the number of vertical Hall element contacts, e.g., 32 or 64. However, it will also be understood that a next vertical Hall element can be shifted by more than one contact from the prior vertical Hall element, in which case, there are fewer vertical Hall elements than there are vertical Hall element contacts in the CVH sensing element.

As shown, a center of a vertical Hall element 0 can be positioned along an x-axis 20 and a center of vertical Hall element 8 can be positioned along a y-axis 22. In the exemplary CVH sensing element 12, there are thirty-two vertical Hall elements and thirty-two vertical Hall element contacts. However, a CVH can have more than or fewer than thirty-two vertical Hall elements and more than or fewer than thirty-two vertical Hall element contacts.

In some applications, a circular magnet 14 having a north side 14b and a south side 14a can be disposed over the CVH 12. The circular magnet 14 tends to generate a magnetic field 16 having a direction from the north side 14b to the south side 14a, here shown to be pointed to a direction of about forty-five degrees relative to x-axis 20.

In some applications, the circular magnet 14 is mechanically coupled to a rotating target object, for example, an automobile steering shaft of an automobile camshaft, and is subject to rotation relative to the CVH sensing element 12. With this arrangement, the CVH sensing element 12, in combination with an electronic circuit described below, can generate a signal related to the angle of rotation of the magnet 14, i.e., an angle of rotation of the target object to which the magnet is coupled.

Figure 1A:
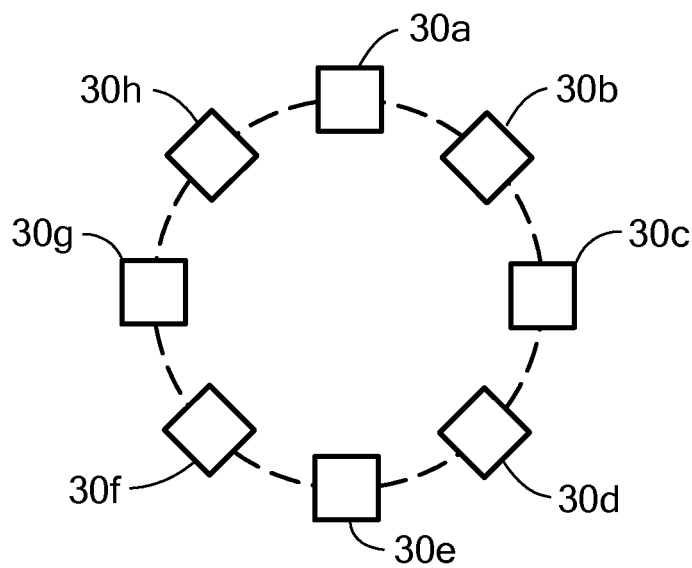
FIG. 1A is a pictorial showing a plurality of magnetic field sensing elements.

Referring now to FIG. 1A, a plurality of magnetic field sensing elements 30a-30h, in a general case, can be any type of magnetic field sensing elements. The magnetic field sensing elements 30a-30h can be, for example, separate vertical Hall elements or separate magnetoresistance elements, each having an axis of maximum response parallel to a surface of a substrate 34, each pointing in a different direction in the plane of the surface. These magnetic field sensing elements can be coupled to an electronic circuit the same as or similar to electronic circuits described below in conjunction with FIGS. 3 and 6. There can also be a magnet the same as or similar to the magnet 14 of FIG. 1 disposed proximate to the magnetic field sensing elements 30a-30h.

Figure 2:
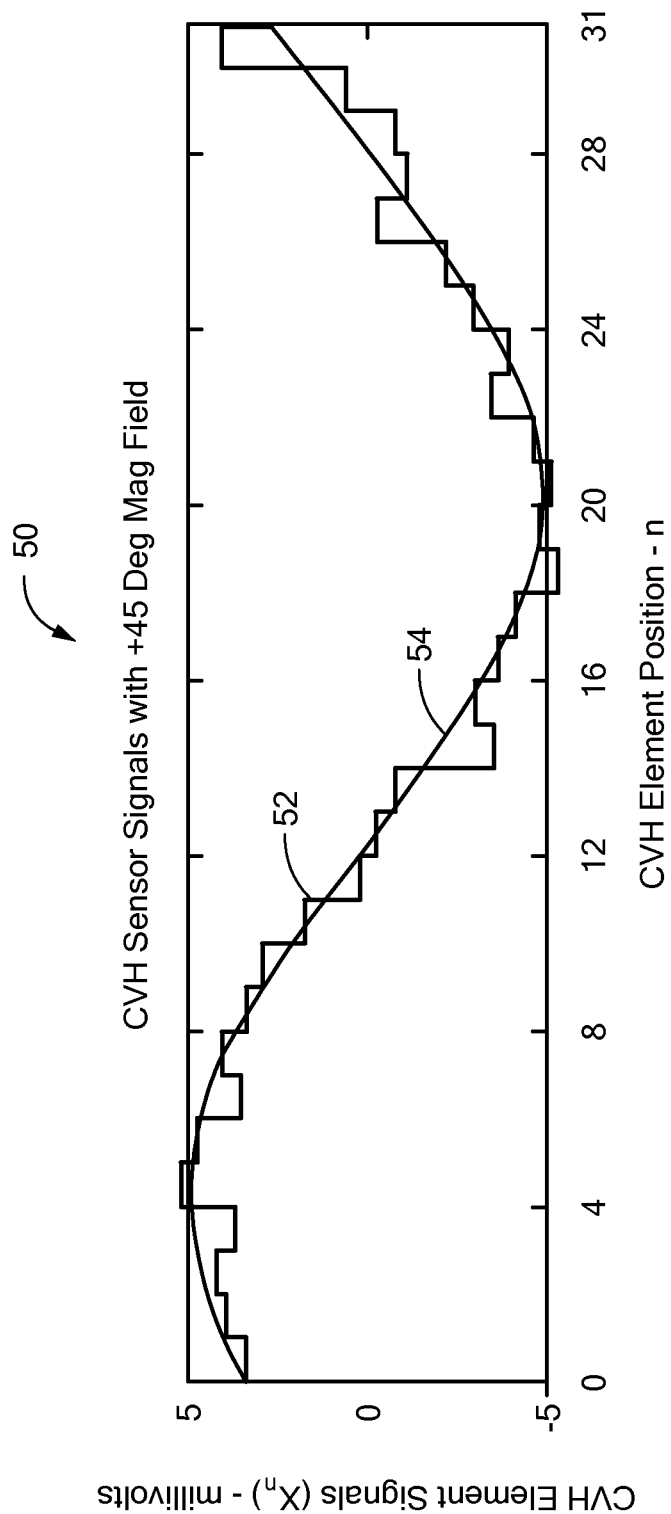
FIG. 2 is a graph showing an output signal as may be generated by the CVH sensing element of FIG. 1 or by the plurality of magnetic field sensing elements of FIG. 1A.

Referring now to FIG. 2, a graph 50 has a horizontal axis with a scale in units of CVH, vertical Hall element position, n, around a CVH sensing element, for example, the CVH sensing element 12 of FIG. 1. The graph. 50 also has a vertical axis with a scale in amplitude in units of millivolts. The vertical axis is representative of output signal levels from the plurality of vertical Hall elements of the CVH sensing element taken sequentially, one at a time, about the ring of contacts of the CVH sensing element.

The graph 50 includes a signal 52 representative of output signal levels from the plurality of vertical Hall elements of the CVH taken with the magnetic field of FIG. 1 pointing in a direction of forty-five degrees.

Referring briefly to FIG. 1, as described above, vertical Hall element 0 is centered along the x-axis 20 and vertical Hall element 8 is centered along the y-axis 22. In the exemplar CVH sensing element 12, there are thirty-two vertical Hall element contacts and a corresponding thirty-two vertical Hall elements, each vertical Hall element having a plurality of vertical Hall element contacts, for example, five contacts. In other embodiments, there are sixty-four vertical Hall element contacts and a corresponding sixty-four vertical Hall elements.

In FIG. 2, for the magnetic field 16 pointing at positive forty-five degrees, a maximum positive signal is achieved from a vertical Hall element centered at position 4, which is aligned with the magnetic field 16 of FIG. 1, such that a line drawn between the vertical Hall element contacts (e.g., five contacts) of the vertical Hall element at position. 4 is perpendicular to the magnetic field. A maximum negative signal is achieved from a vertical Hall element centered at position 20, which is also aligned with the magnetic field 16 of FIG. 1, such that a line drawn between the vertical Hall element contacts (e.g., five contacts) of the vertical Hall element at position 20 is also perpendicular to the magnetic field.

A sine wave 54 is provided to more clearly show ideal behavior of the signal 52. The signal 52 has variations due to vertical Hall element offsets, which tend to cause corresponding variations of output signals causing them to be too high or too low relative to the sine wave 54, in accordance with offset errors for each element. The offset signal errors are undesirable.

Full operation of the CVH sensing element 12 of FIG. 1 and generation of the signal 52 of FIG. 2 are described in more detail in the above-described PCT Patent Application No. PCT/EP2008/056517, entitled "Magnetic Field Sensor for Measuring Direction of a Magnetic Field in a Plane," filed May 28, 2008, which is published in the English language as PCT Publication No. WO 2008/145662.

Groups of contacts of each vertical Hall element can be used in a chopped arrangement (also referred to herein as current spinning) to generate chopped output signals from each vertical Hall element. Thereafter, a new group of adjacent vertical Hall element contacts can be selected (i.e., a new vertical Hall element), which can be offset by one element from the prior group. The new group can be used in the chopped arrangement to generate another chopped output signal from the next group, and so on.

Each step of the signal 52 is representative of an unchopped output signal, i.e., from one respective group of vertical Hall element contacts, i.e., from one respective vertical Hall element. Thus, for a CVH sensing element having 32 vertical Hall elements taken sequentially, there are thirty-two steps in the signal 52 when current spinning is not used. However, for embodiments in which current spinning is used, each step of the signal 52 can be comprised of several sub-steps (not shown, e.g., four sub-steps), each sub-step indicative of a current spinning "phase."

Current spinning and current spinning phases are described more fully below in conjunction with FIGS. 4-4C.

It will be understood that a phase of the signal 52 is related to an angle of the magnetic field 16 of FIG. 1 relative to position zero of the CVH sensing element 12. It will also be understood that a peak amplitude of the signal 52 is generally representative of a strength of the magnetic field 16. Using electronic circuit techniques described above in PCT Patent Application No. PCT/EP20081056517, or using other techniques described below, a phase of the signal 52 (e.g., a phase of the signal 54) can be found and can be used to identify the pointing direction of the magnetic field 16 of FIG. 1 relative to the CVH sensing element 12.

The signal 52 is referred to herein as a "sequenced signal" 52, which will be understood to be comprised of sequential ones of a plurality of magnetic field signals, each magnetic field signal generated by a respective one of a plurality of magnetic field sensing elements, e.g., the plurality of vertical Hall elements within a CVH sensing element.

Figure 3:
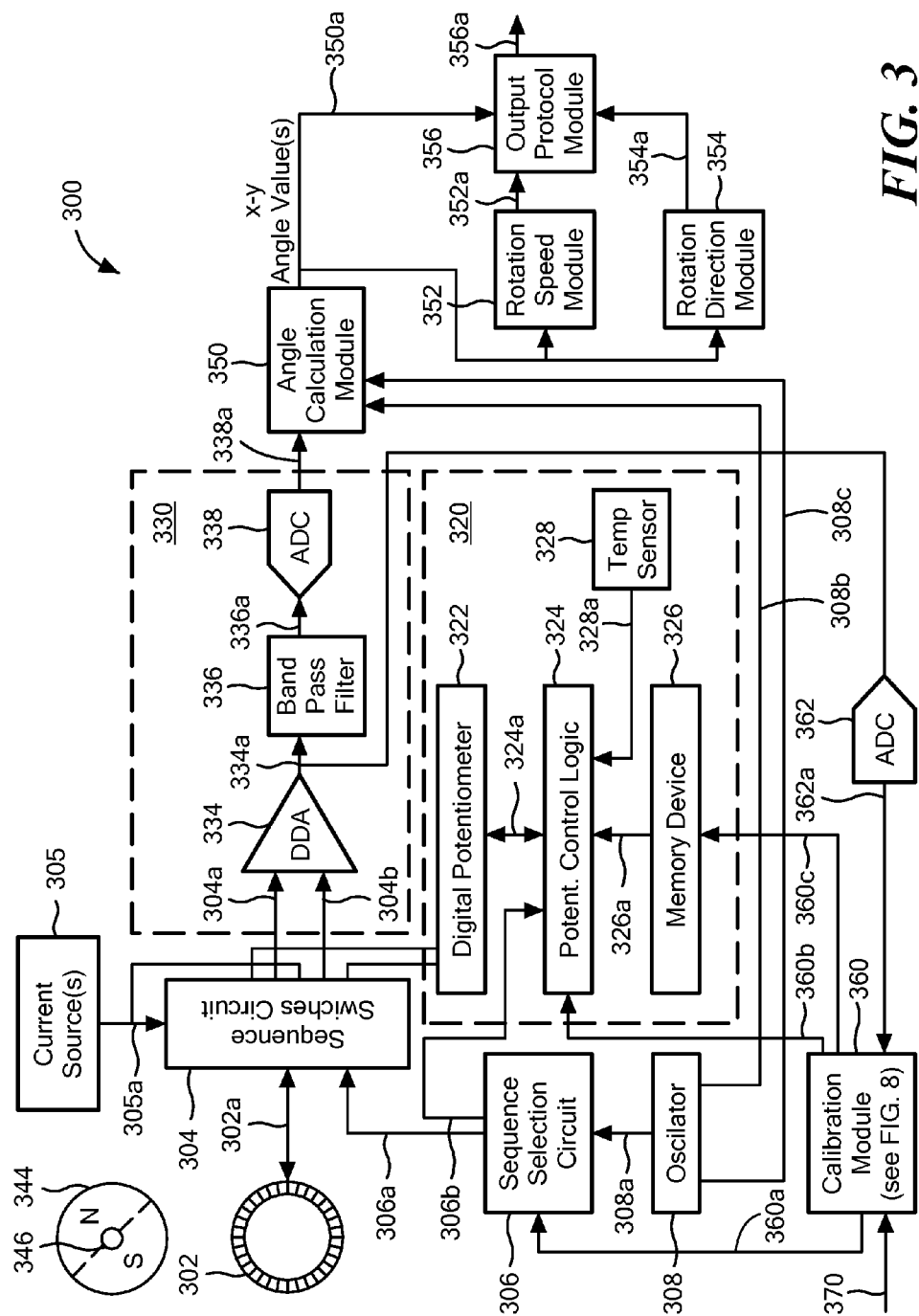
FIG. 3 is a block diagram of an exemplary magnetic field sensor having a CVH sensing element and a digital potentiometer (or variable potentiometer) circuit for offset cancellation that can improve an accuracy of the magnetic field sensor.

Referring now to FIG. 3, an exemplary magnetic field sensor 300 with improved accuracy is shown. The magnetic field sensor 300 includes a CVH sensing element 302 having a plurality of vertical Hall elements, with each vertical Hall element comprising a group of vertical Hall element contacts (e.g., five vertical Hall element contacts). In some embodiments, the CVH sensing element 302 can be the same as or similar to the CVH sensing element 1.2 described above in conjunction with FIG. 1, and in one aspect the CVH sensing element 302 can be disposed proximate to a two pole magnet 344 (e.g., a circular permanent magnet with north pole and a south pole) coupled to a target object 346, which magnet 344 can be the same as or similar to the magnet 14 of FIG. 1. However, in other embodiments, the CVH sensing element 302 can be replaced by a group of magnetic sensing elements that are the same as or similar to those described above in conjunction with FIG. 1A. The CVH sensing element 302 is configured to generate a plurality of magnetic field signals 302a, one at a time. Thus, the coupling at 302a can actually include a plurality of couplings to the plurality of vertical Hall elements within the CVH sensing element.

The CVH sensing element 302 can be coupled to a sequence switches circuit 304 that sequences through the vertical Hall elements of the CVH sensing element 302 to generate a differential sequenced signal 304a, 304b. The differential sequenced signal 304a, 304b can be the same as or similar to the sequenced signal 52 of FIG. 2.

The sequence switches circuit 304 can be coupled to a sequences selection circuit 306, which can be configured to generate a sequence control signal 306a. The sequence control signal 306a may, for example, control and/or indicate switching (or indexing) of the vertical Hall elements. The sequence selection module 306 can be coupled to an oscillator 308 and a potentiometer control logic circuit 324. The oscillator 308 can be configured to provide a clock signal 308a to the sequence selection circuit 306 for sequential selection of sequential ones of the plurality of vertical Hall elements of the CVH sensing element 302.

The sequence switches circuit 304 can additionally be coupled to a current source 305, which can be configured to generate one or more current signals 305a. The sequence switches circuit 304 can be configured to receive the one or more current signals 305a and to provide the current signals 305a to selected vertical Hall elements within the CVH sensing element 302.

The sequence switches circuit 304 can further be coupled to a potentiometer system 320. The potentiometer system 320 can comprise a digital potentiometer (or variable potentiometer) 322, which can be coupled to a potentiometer control logic circuit 324. The digital potentiometer 322 is described more fully below in conjunction with FIG. 7C. The potentiometer control logic circuit 324 can be coupled to a memory device 326. The digital potentiometer 322 can be further coupled to a temperature sensor 328. The digital potentiometer 322 can be configured to attenuate the offset of one or more of the magnetic field signals that are sequenced within the differential sequenced signal 304a, 304b, with or without current spinning, to produce the differential sequenced signal 304a, 304b as a differential sequenced output signal 304a, 304b that is sequentially attenuated by sequentially selected factors.

The potentiometer control logic circuit 324 can be coupled to receive a control signal 306b from the sequence selection circuit 306, the control signal 306b indicative of which one of the vertical Hall elements within the CVH sensing element 302 is currently being processed, and configured to adjust switches within the digital potentiometer 322 via the control signal 324a synchronously with the clock signal 308a and synchronously with changes of the control signal 306b, which can be synchronous with individual samples of the magnetic field signals within the differential sequenced signal 304a, 304b, synchronous with steps of the signal 52 of FIG. 2.

In some embodiments, the potentiometer control logic circuit 324 can also be coupled to receive a temperature signal 328a from the temperature sensor 328. In these embodiments, the potentiometer control logic circuit 324 can also adjust the switches within the digital potentiometer 322 in accordance with the temperature signal 328a.

The potentiometer control logic circuit 324 can be coupled to a memory device 326, which can be configured to store a plurality of potentiometer control values representative of a plurality of switch settings of the digital potentiometer 322. The plurality of switch settings of the digital potentiometer 322 can correspond to offset attenuations (i.e., offset attenuation factors) applied to the each of the magnetic field signals within the differential sequenced signal 304a, 304b, i.e., sequentially to each one of the vertical Hall elements within the CVH sensing element 302.

In some embodiments, the memory device 326 can store a plurality of values representative of the plurality switch setting of the digital potentiometer 322 for a plurality of different temperatures.

The memory device 326 can be coupled to receive and store one or more potentiometer control values 360c, and can be configured to supply the one or more stored potentiometer control values 326a to the potentiometer control logic circuit 324.

The potentiometer control logic 324 can be configured to select one or more stored potentiometer control values from the memory device 326 and can be configured to adjust the switch settings (i.e., offset attenuation factors) of the digital potentiometer 322 based upon the selected one or more correction coefficients.

It will be appreciated that the potentiometer control logic circuit 324 can make adjustments to the switch settings of the digital potentiometer 322 according to other characteristics of the magnetic field sensor 300.

The differential sequenced signal 304a, 304b and the potentiometer system 320 can be coupled to a signal processing system 330. The signal processing system 330 can be configured to receive and process the differential sequenced signal 304a, 304b, which has been sequentially attenuated by operation of the potentiometer system 320. The signal processing system 330 can comprise a dual-input differential amplifier (DDA) 334, a band-pass filter 336, and an analog-to-digital converter (ADC) 338.

The DDA 338 can be coupled to receive the differential sequenced signal 304a, 304b and configured to generate an amplified signal 334a.

The bandpass filter 336 can be coupled to receive the amplified signal 334a and configured to generate a filtered signal 336a. The ADC 338 can be coupled to receive the filtered signal 336a and configured to generate a converted digital signal 338a.

The signal processing system 330, particularly the ADC 338 of the si Anal processing system 330, can be coupled to an angle calculation module 350. It is to be appreciated that the arrangement described above is only one of many potential configurations of the signal processing system 330.

The angle calculation module 350 can be coupled to receive the converted digital signal 330a and configured to generate an x-y angle signal 350a having x-y angle values indicative of the angle of the magnetic field generated by the magnet 344. In operation, the x-y angle signal 350a would have a larger angle error component were it not for operation of the potentiometer system 320. The angle error component is described more fully below in conjunction with FIG. 5. Let it suffice here to say that the angle error component is an angle error component that would otherwise cause the x-y angle signal 350a to not be perfectly representative of the true angle of the magnetic field generated by the magnet 344.

The angle calculation module 350 can be further coupled to receive clock signals 308b, 308c from the oscillator 308.

The magnetic field sensor 300 can further include a rotation speed module 352, a rotation direction module 354, and an output protocol module 356, each of which is coupled to receive the x-y angle signal 350a. It will be understood that the x-y angle signal 350a can change, and therefore, can be representative of a rotating magnetic field when the magnet 344 rotates.

The rotation speed module 352 can be configured to generate a rotation speed signal 352a indicative of a rotation speed of the magnet. The rotation direction module 354 can be configured to generate a direction signal 354a indicative of a rotation direction of the magnet 344.

The output protocol module 356 can be coupled to receive the x-y angle signal 350a, the rotation speed signal 352a, and the rotation direction signal 354a. The output protocol module 356 can be configured to generate an output signal 356a representative of one or more of the angle of the magnetic field generated by the magnet 344, representative of the speed of rotation of the magnet 344, or representative of the direction of rotation of the magnet 344. The output signal 356a can have in one of a variety of conventional formats, for example, an SPI format, a CAN format, an I2C format, or a Manchester format.

In some embodiments, the magnetic field sensor 300 can include a calibration module 360. The calibration module 360 can be coupled to receive a digital signal 362a from an analog to digital converter (ADC) 362. The ADC 262 can be coupled to receive the amplified signal 334a. The calibration module 360 can be configured to generate a calibration sequence clock signal 360a received by the sequence module 306, a potentiometer control signal 360h received by the potentiometer control logic circuit 324. The calibration module 360 can also be configured to generate the one or more potentiometer control values 360c that are used in normal operation.

The calibration module 360 can be coupled to receive a calibration control signal 370 received from outside to the magnetic field sensor 300. The calibration control signal 370 can operate to place the magnetic field sensor 300 into a calibration mode of operation.

Operation of the calibration module 360 is described more fully below in conjunction with FIG. 8. However, let it suffice here to say that the calibration module can identify a best setting offset attenuation factors) of the digital potentiometer 322 for each one of the vertical Hall elements within the CVH sensing element 302, and can store those best offset attenuation factors 360c.

In some other embodiments, the calibration module 360 is outside of the magnetic field sensor 300, and the signals into and out of the calibration module 360 extend outside of the magnetic field sensor 300.

In operation, the digital potentiometer 322 of the digital potentiometer system 320 can act as an offset attenuator for the differential sequenced signal 304a, 304b of the sequence switches circuit 304 to reduce or equilibrate the offset of each CVH sensing element 302. The digital potentiometer system 320 may also be used for correcting error fluctuations in the transfer characteristic of the magnetic field sensor 300 due to factors such as temperature, aging, mechanical stress, and voltage offset.

In operation, the potentiometer control logic 324 can be configured to sequentially adjust the offset of the differential sequenced signal 304a, 304b for each one of the steps of the differential sequenced signal 304a, 304b by setting switches of the digital potentiometer 322. The attenuations can be applied to the differential sequenced signal 304a, 304b to reduce the offset error of the CVH sensing element 302. In the case of an 8-bit digital potentiometer, for example, two hundred fifty five different selections of attention may be applied to the differential sequenced signal 304a, 304b. Adjustment of the attenuations can cause the voltage output of each vertical Hall element within the CVH sensing element 302 to change accordingly, resulting in a smaller difference between offsets associated with the plurality of vertical Hall elements within the CVH sensing element 302.

When using a digital potentiometer 322 with four control bits, for example, an offset difference reduction of approximately 10 to 12 times can be achieved. By adding a fine adjustment with 4 more bits, a total offset difference reduction of over 100 times is possible. The offset difference reduction achieved can be dependent on the number of control bits, i.e., the number of switches Sw1-SwN, of the digital potentiometer 322.

In some other embodiments, the attenuations applied to the differential sequenced signal 304a, 304b can be dynamically selected by an algorithm within the potentiometer control logic circuit 324, which can monitor the differential sequenced signal 304a, 304b by means of an analog-to-digital converter (not shown), for example. The algorithm may receive an input representative of the differential sequence signal 304a, 304b and set the attenuation in proportion to that input.

In operation, the potentiometer control logic 324 may receive a clock signal 306b from the oscillator 306 of FIG. 3. The clock signal 306b may, for example, indicate a change in the selection of the CVH sensing element by the sequence selection module 304.

In operation, the memory device 326 may store values representative of switch settings of the digital potentiometer 322. The potentiometer control logic can read the stored values (i.e., stored potentiometer control values) from the memory device 326. The memory device 326 can be electrically erasable programmable read-only memory (EEPROM), or the like. The switch setting values (potentiometer control values) stored in the memory device 326 may be selectively and sequentially read by the potentiometer control logic circuit 324 to adjust the digital potentiometer 322 to desired states. At each switching (or indexing) of the vertical Hall elements within the CVH sensing element 302, a respective potentiometer control value can be loaded by the potentiometer control logic circuit 324 into the digital potentiometer 322 from the memory device 326.

In some embodiments, the potentiometer control logic circuit 324 can comprise other non-transitory, removable/non-removable, volatile/non-volatile computer memory devices to store software instructions for adjusting the digital potentiometer 322 in accordance with the above described methods.

The potentiometer control logic 324 can receive the temperature signal 328a from the temperature sensor 328 to compensate for temperature variations experienced by the magnetic field sensor 300. The temperature sensor 328 is preferably integrated on the magnetic field sensor 300 and is operable to send the temperature signal 328a representative of a temperature of the environment to the potentiometer control logic circuit 324 which, in turn, is operable to modify the switch settings of the digital potentiometer 322 in response to temperature variations. To this end, the memory device can receive potentiometer control values 340a associated with different temperatures, and the potentiometer control logic circuit can select stored potentiometer control values 326a according to the temperature signal 328a.

In operation, the temperature can be continuously detected by the temperature sensor 328. Dynamic sensing by the tempera=sensor 300 and providing the temperature signal 328a to the potentiometer control logic circuit 324 provides for magnetic field sensing that is adaptive to temperature variations resulting from the magnetic field sensor 300 experiencing different temperatures.

Temperature compensation of the magnetic field sensor 300 can also be accomplished by using a temperature-dependent digital potentiometer that is controlled through the use of an internal digital look-up table, for example. Other well known means of temperature compensation such as using the temperature-dependent junction voltages of diodes, temperature-dependent resistors, or a digital microprocessor are also available.

The magnetic field sensor 300 can also be encased by a heat insulating structure such that the temperature of the magnetic field sensor 300 remains substantially constant and independent of the external environment.

In operation, the angle calculation module 350 compares a relative phase of the converted digital signal 330a and one of the clock signals 308b, 308c.

The x-y angle signal 350a can be calculated through analysis of zero-crossings of the converted digital signal 330a received from the ADC 338.

It is to be appreciated that the potentiometer system 320 of FIG. 3 has been described as being comprised of units (e, g., the digital potentiometer 322, the potentiometer control logic 324, and the memory device 326). It should be appreciated, however, that this is merely a functional description and that software, hardware, or a combination of software and hardware can, perform the respective functions of the potentiometer system 320 in an equivalent manner. The potentiometer control logic, for example, can be software, hardware, or a combination of software and hardware.

Additional aspects of the exemplary magnetic field sensor 300, with particular focus on the potentiometer control system 320, are described in greater detail below in conjunction with FIGS. 5-8.

Figure 4:
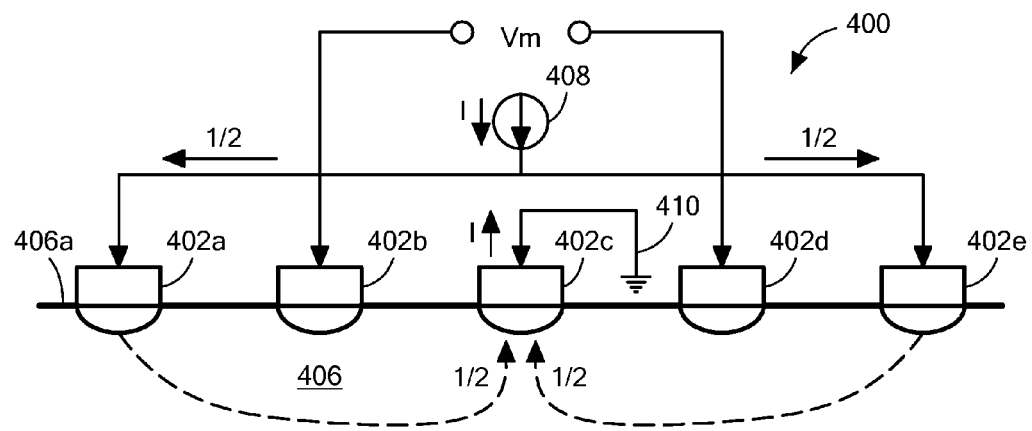
FIGS. 4-4C are side views of exemplary vertical Hall elements of the CVH sensing element of FIG. 3 when coupled into four current spinning phases, each phase associated with operation of one of the vertical Hall elements of the CVH sensing element of FIG. 3.
Figure 4A:
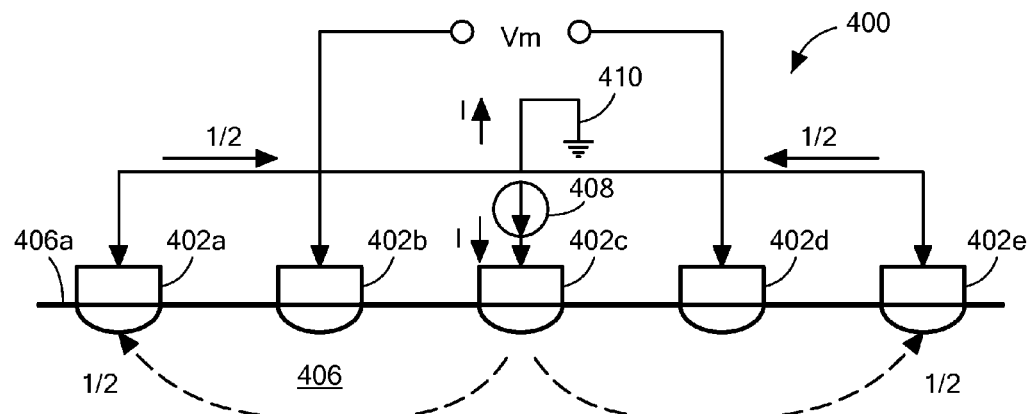
Figure 4B:
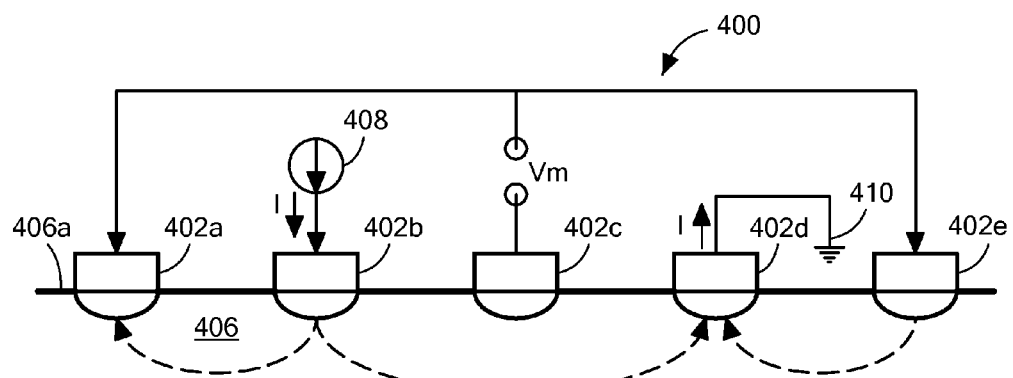
Figure 4C:
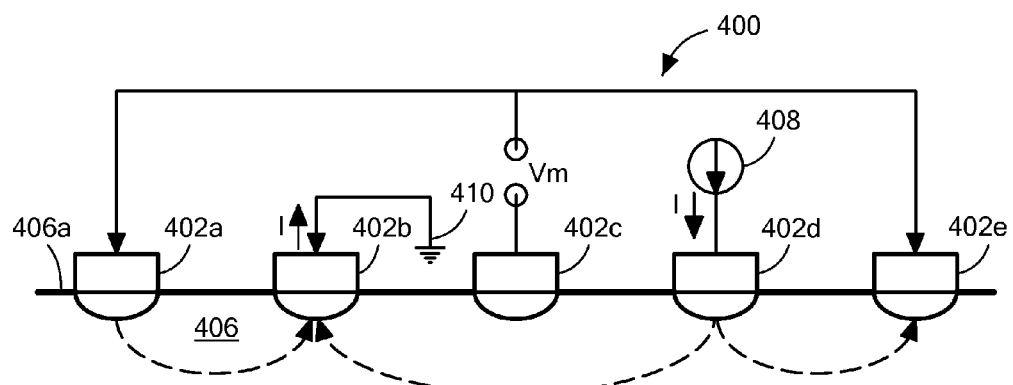

FIGS. 4-4C are representative of a four phase current spinning or chopping that can be used for any vertical Hall element having five contacts. Thus, it should be appreciated that such current spinning can be used for each selected vertical Hall element within the CVH sensing element 12 of FIG. 1 and the CVH sensing element 302of FIG. 3. It should also be appreciated that such current spinning can also be used for separate magnetic field sensing elements, for example, the magnetic field sensing elements 30a-30h of FIG. 1A, where the magnetic field sensing elements 30a-30h are selected and chopped one of the time.

Referring now to FIG. 4, a vertical Hall element 400 is comprised of five vertical Hall element contacts, namely, first, second, third, fourth, and fifth vertical Hall element contacts, 402a, 402b, 402c, 402d, 402e, respectively. In a first chopping or current spinning phase, a current source 408, which can be the same as or similar to the current sources 305 of FIG. 3, can be coupled to the first and fifth vertical Hall element contacts 402a, 402e, respectively, which are coupled together, and can provide a total current of I, half of the current, I/2, flowing to the first vertical a Hall element contact 402a and half of the current, I/2, flowing to the fifth vertical Hall element contact 402e. The third vertical Hall element contact 402c is coupled to a voltage reference 410, for example, ground. Currents from the current source 408 flow from the first and fifth vertical Hall element contacts 402a, 402e, respectively, through a substrate 406 (e.g., through an epitaxial layer upon a substrate) of the vertical Hall element 400 to the third vertical Hall element contact 402c, as represented by dashed lines.

A signal, Vm, responsive to an external magnetic field, results between the second and fourth vertical Hall element contacts 402b, 402d, respectively. Thus, in the first current spinning phase, current spinning switches can select the second and fourth vertical Hall element contacts 402b, 402d to provide an output signal, and can select the first, fifth, and third vertical Hall element contacts 402a, 402e, 402c, respectively, as those contacts coupled to the current sources 305 of FIG. 3. Couplings during other current spinning phases described below will be apparent.

Referring now to FIG. 4A, in which like elements of FIG. 4 are shown having like reference designations, in a second current spinning phase of the same vertical Hall element 400 (same five vertical Hall element contacts), couplings are changed by current spinning switches. In the second phase, the current source 408 is coupled to the third vertical Hall element contact 402c, and the first and fifth vertical Hal element contacts 402a, 402e, respectively, are coupled together and to the reference voltage 410. Thus, the currents flow through the substrate 406 in opposite directions from those shown in FIG. 4.

As in FIG. 4, a signal, Vm, responsive to an external magnetic field, results between the second and fourth vertical Hall element contacts, 402b, 402d, respectively. The signal, Vm, of FIG. 4A is like the signal, Vm, of FIG. 4. However, the offset voltage within the signals can be different, e.g., different in sign.

Referring now to FIG. 4B, in which like elements of FIGS. 4 and 4A are shown having like reference designations, in a third current spinning phase upon the same vertical Hall element 400 (same five vertical Hall element contacts), couplings are again changed by current spinning switches. In the third phase, the current source 408 is coupled to the second vertical Hall element contact 402b, and the fourth vertical Hall element contact 402d is coupled to the reference voltage 410. Thus, a current flows from the second vertical Hall element contact 402b through the substrate 406 to the fourth vertical Hall element contact 402d.

The first and fifth vertical Hall element contacts 402a, 402e, respectively, are coupled together. Some current also flows from the second vertical. Hall element contact 402b through the substrate 406 to the first vertical Hall element contact 402a and through the mutual coupling to the fifth vertical Hall element contact 402e. Some current also flows from the fifth vertical Hall element contact 402e through the substrate 406 to the fourth vertical Hall element contact 402d.

A signal, Vm, responsive to an external magnetic field, results between the first vertical Hall element contact 402a first (and the fifth vertical Hall element contact 402e) and the third vertical Hall element contact 402c. The signal, Vm, of FIG. 4B is like the signal, Vm, of FIGS. 4 and. 4A. However, the offset voltage within the signal can be different.

Referring now to FIG. 4C, in which like elements of FIGS. 4-4B are shown having like reference designations, in a fourth chopping phase upon the same vertical Hall element 400 (same five vertical Ball element contacts), couplings are again changed by current spinning switches. In the fourth phase, the current is reversed from that shown in FIG. 4B. The current source 408 is coupled to the fourth vertical Hall element contact 402d, and the second vertical Hall element contact 402b is coupled to the reference voltage 410. Thus, a current flows from the fourth vertical Hall element contact 402d through the substrate 406 to the second vertical Hall element contact 402b.

The first and fifth vertical Hall element contacts 402a, 402e, respectively, are coupled together. Some current also flows from the fourth vertical Hall element contact 402d through the substrate 406 to the fifth vertical Hall element contact 402e, through the mutual coupling to the first vertical Hall element contact 402a. Some current also flows from the first vertical Hall element contact 402a through the substrate 406 to the second vertical Hall element contact 402b.

A signal, Vm, responsive to an external magnetic field, results between the first vertical Hall element contact 402a (and the fifth vertical Hall element contact 402e) and the third vertical Hall element contact 402c. The signal, Vm, of FIG. 4C is like the signal, Vm, of FIGS. 4-4B. However, the offset voltage within the signal can be different.

The signals, Vm, provided by the four phases of chopping of FIGS. 4-4C are responsive to an external magnetic field.

As described above, after generating the four current spinning phases on any one vertical Hall element within the CVH sensing element 402, by sequencing operation of the sequence switches circuit 304 of FIG. 3, the current spinning arrangements of FIGS. 4-4C can move to a next vertical Hall element, e.g., five vertical Hall element contacts offset by one vertical Hall element contact from those shown in FIGS. 4-4C, and the four current spinning phases can be performed on the new vertical Hall element by operation of current spinning switches.

While four current spinning phases are described above, it will become apparent from discussion below in conjunction with FIGS. 7A and 7B that only one phase, i.e., the couplings of FIG. 4A are used in the magnetic field sensor 300 of FIG. 3. Thus, current spinning is not used in embodiments herein.

Referring now to FIG. 5, a graph 500 has a horizontal axis with a scale in units of angular degrees and a vertical axis with a scale in units of value of an x-y angle value magnitude, for example, a magnitude of the x-y angle signal 350a of FIG. 3.

A line 502 is representative of an x-y angle value that has no angle error. When the x-y angle value has no angle error, the x-y angle value is perfectly linear with respect to actual angle, i.e., the x-y angle value is a perfect and true representation of the angle of the magnetic field generated by the magnet 344 of FIG. 3, and the line 502 passes through zero.

A line 504 is representative of an x-y angle value that has only an average or DC angle error, such that all angles represented by the x-y angle value are offset by a fixed lumber of degrees. The line 504 does not pass through zero.

A curve 506 is representative of an x-y angle value that has errors in representation of the true angle of the magnetic field generated by the magnet 344, average or DC errors and also an error that has a sinusoidal appearance.

A curve 508 is representative of an x-y angle value that has other errors in representation of the true angle of the magnetic field generated by the magnet 344.

A variety of circuit characteristics of the magnetic field sensor 100 contribute to the errors, i.e., to both the DC (or average) angle error represented by the curves 506, 508, and to the sinusoidal shapes of the curves 506, 503. One factor that contributes to the errors is switching noise generated by the sequence switches 304 of FIG. 3.

First, regarding the sequence switches circuit 304, it will be understood that charge injection or switching spikes (together referred to as noise) generated by the sequence switches 104 are not necessarily exactly the same as each sequential vertical Hall element is selected in the CVH sensing element 302. When the noise generated by the sequence switches 304 is not the same as each vertical Hall element is selected, a DC (or average) angle error is generated and also a sinusoidal type error such as that represented by the curves 506, 508. The sinusoidal error characteristic can be, in part, a result of the noise generated by the sequence switches being repetitive for each cycle around the CVH sensing element 302, and thus, the noise will have an angle error frequency component at a frequency of the signal 52 of FIG. 2, and will add to the signal 52 (350a of FIG. 3). The angle error frequency component is essentially fixed in phase relative the signal 350a, and therefore, the addition of the angle error causes different phase shift errors in the summed signal depending on the phase of the signal 350a. Higher harmonics can also result from the noise.

Other circuit characteristics can also contribute to the angle errors, i.e., to both the DC (or average) angle error represented by the error curves 506, 508, and to the sinusoidal shapes of the error curves 506, 508. Namely, a speed with which the dual differential simplifier 334 of FIG. 3, and, also other circuit elements of FIG. 3, are unable to settle to final values as the sequence switches circuit 304 switches among the vertical Hall elements of the CVH sensing element 302 contributes to the errors.

The above-described circuit characteristics, including, but not limited to, switching noise and lack of circuit elements settling to final values, tend to be influenced by (i.e., changed by) a variety factors including, but not limited to, temperature of the magnetic field sensor 300 of FIG. 3, rate of sequencing around the CVH sensing element 302, and peak magnitude of the magnetic field experience by the CVH sensing element 302 as the magnet 344 rotates.

Differences between the curves 506, 508 can be attributed to changes in the same factors, namely, changes in the temperature, changes in or differences in peak amplitude of the magnetic field experience by the CVH sensing element 302 as the magnet 344 rotates, and changes in or differences in rates of sequencing around the CVH sensing element 302. Among these factors, it will be understood that the changes in the temperature can occur at any time. The changes in the peak amplitude of the magnetic field can be influenced by positional changes, i.e., air gap changes, between the magnet 344 and the CVH sensing element 302 of FIG. 3. The changes in the peak amplitude of the magnetic field can also be influenced by mechanical considerations, for example, wear of a bearing or the shaft 346 upon which the magnet 344 rotates. However, the sequencing rates can be fixed, and changed only for different applications of the magnetic field sensor 300.

In general, it has been determined that the dominant angle error frequency components occur at first and second harmonics of the frequency of the signal 52 (i.e., 304a, 304b). The curves 506, 508 are representative of angle error functions dominated by first and second harmonics of the frequency of the signal 52 (304a, 304b).

The potentiometer system of FIG. 3 is configured to equalize offsets among the vertical Hall elements within the CVH sensing element 302, resulting in smaller error components.

As temperature varies, each harmonic component of the angle error represented by curves 506, 508 can change independently in amplitude and phase.

Figure 6:
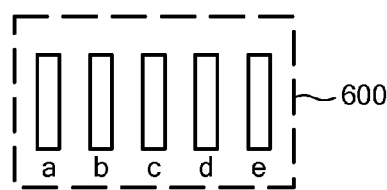
FIG. 6 is a block diagram showing contacts of one of the vertical Hall elements within the CVH sensing element of FIG. 3.

Referring now to FIG. 6, a vertical Hall element 600 can be representative of one of the vertical Hall elements within the MT sensing element 302 of FIG. 3. As described above, each vertical Hall element within the CVH sensing element 302 of FIG. 3 comprises a group of vertical. Hall element contacts (e.g., five vertical Hall element contacts), here labeled a-e with the labels comparable in other figures below.

Figure 7A:
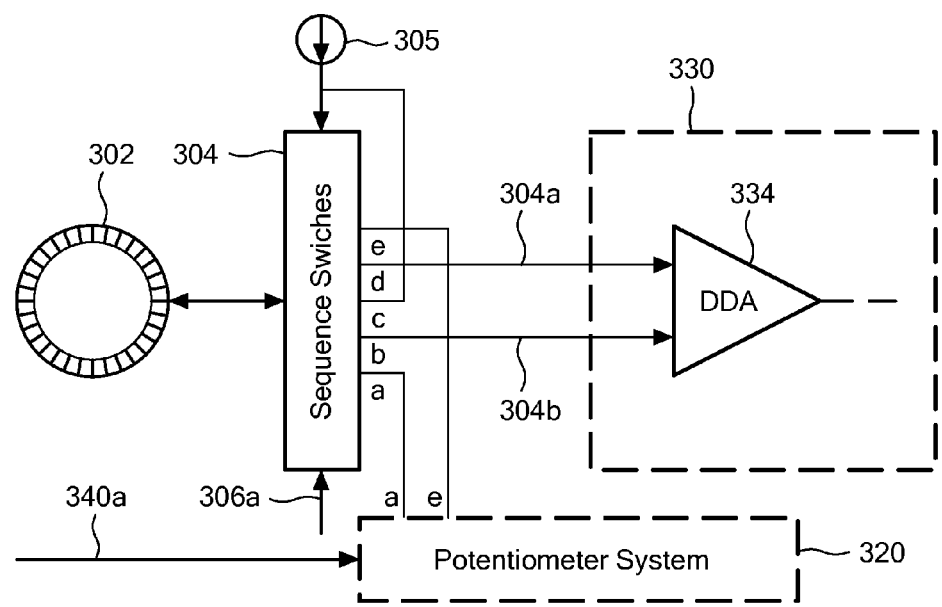
FIG. 7A is a block diagram showing a circuit for attenuating output signals of the sequence switches circuit, i.e., output signals from the CVH sensing element of FIG. 3.

Referring now to FIG. 7A, in which like elements of FIG. 3 are shown having like reference designations, the CVH sensing element 302 is coupled to the sequence switches circuit 304 is illustrated with the vertical Hall element contacts A-e of FIG. 6 explicitly shown.

Figure 7B:
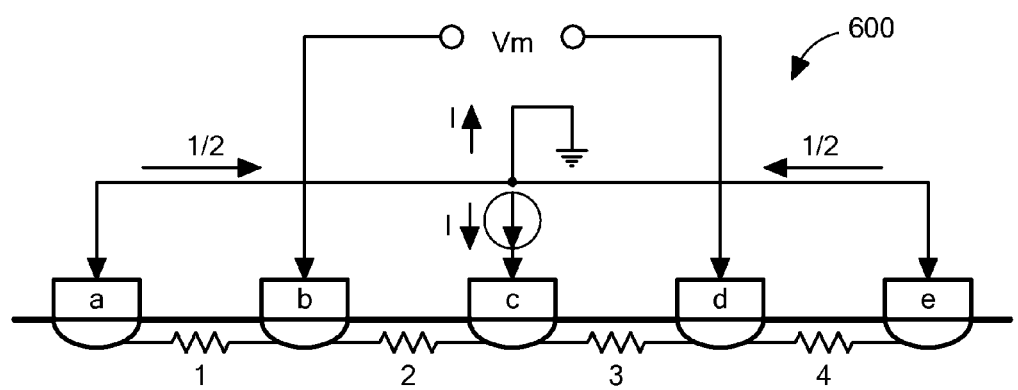
FIG. 7B is a side view of the vertical Hall element of FIG. 4A showing bulk resistance that exists between the element contacts.

Referring now to FIG. 7B, in which like elements of FIG. 6 are shown having like reference designations, the vertical Hall element 600 is shown to be fixed in the phase of FIG. 4A and has the same five vertical Hall element contacts labeled here as a-e as in FIG. 6. Resistors, 1, 2, 3, and 4 are shown between each adjacent pair of vertical Hall element contacts a-b, b-c, c-d, d-e, respectively. The resistors 1, 2, 3, and 4 correspond to the bulk resistance of a substrate, which may arise due to the inherent properties of the substrate over which the vertical Hall element contacts are formed. As is known, the bulk resistance of the substrate may vary based upon a wide variety of factors including the composition of the substrate material and the temperature thereof.

Figure 7C:
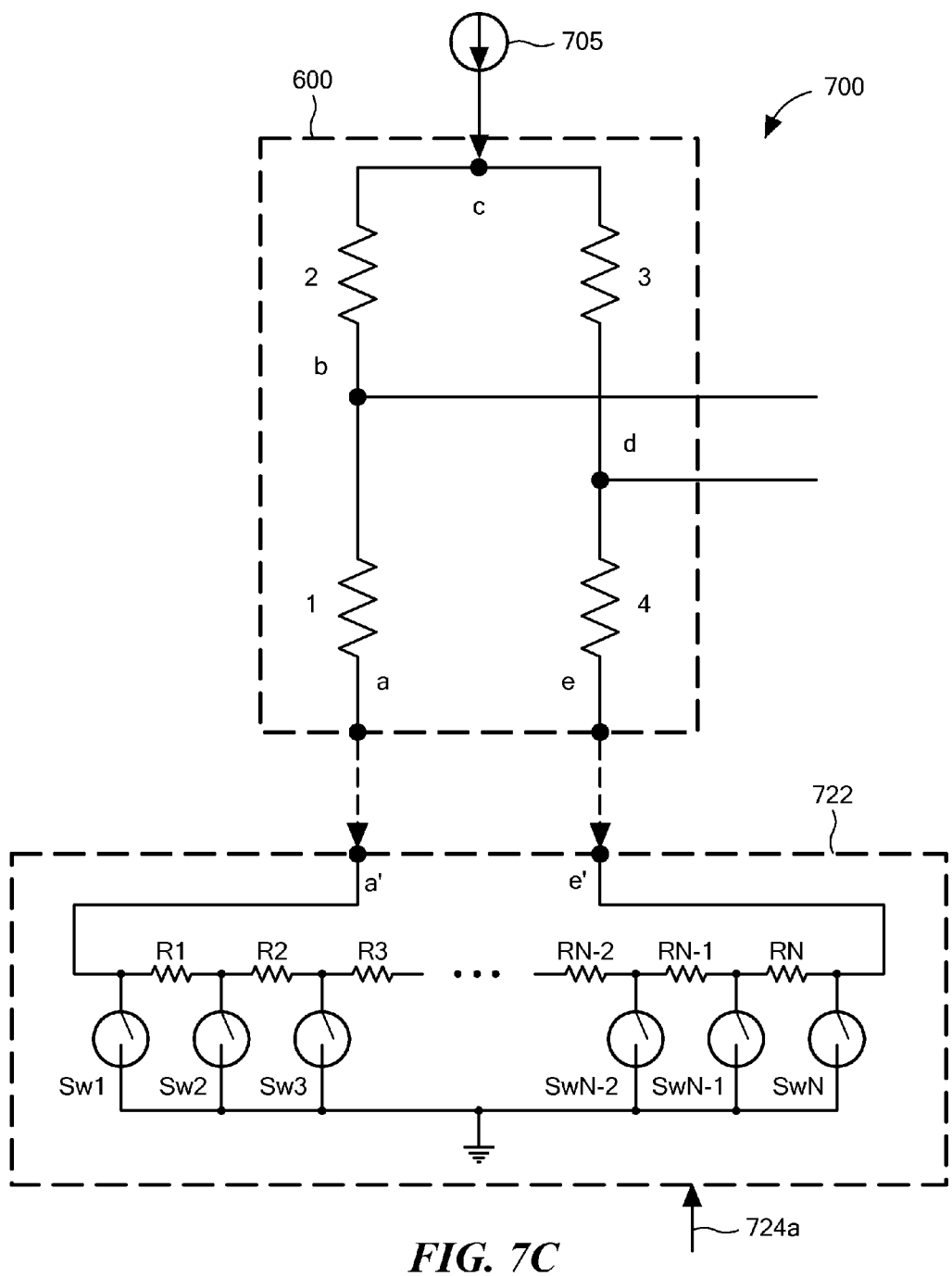
FIG. 7C is a schematic showing an equivalent circuit of the vertical Hall element of FIG. 7B coupled to the digital potentiometer circuit of FIG. 3.

Referring now to FIG. 7C, in which like elements of FIG. 6 are shown having like reference designations, an equivalent circuit 700 is shown which is representative of the vertical. Hall element 600 of FIGS. 6 and 7A in the fixed coupling arrangement of FIG. 7A and is coupled to digital potentiometer 722, which can be the same as or similar to the digital potentiometer 322 of FIG. 3. As illustrated in. FIG. 7C and as described above with respect the FIGS. 7A and 7B, resistors 1, 2, 3, and 4 of FIG. 7B are arranged between vertical Hall element contacts a, b, c, d, and e. The resistors include a first resistive element 1 connected between contacts a and b, a second resistive element 2 connected between contacts b and c, a third resistive element 3 connected between contacts c and d, and a fourth resistive element 4 connected between contacts e and d. An output comprising contacts b and d is coupled to both the digital potentiometer 722 as shown, and also to a DDA, for example, the DDA 334 of FIG. 3. The resistors 1-4 (i.e., a vertical Hall element within the CVH sensing element 302 of FIGS. 3 and 7) are driven by one or more current sources 705, which is coupled to the vertical Hall element contact c.

The digital potentiometer 722 comprises a plurality of switches (Sw1, Sw2 . . . SwN) for controlling the digital potentiometer 722. As described above in conjunction with FIG. 3, the plurality of switches (Sw1, Sw2 . . . SwN), i.e., switches within the digital potentiometer 322 of FIG. 3, is controlled by the potentiometer control logic circuit 324. Also within the digital potentiometer 322 of FIG. 3, the plurality of switches is coupled to a resistor network R1-RN. In operation, different settings of the switches (Sw1, Sw2 . . . SwN) provide dynamic scaling of signals within the differential sequenced signal 304a, 304b for corresponding ones of the vertical Hall elements within the CVH sensing element 302 of FIG. 3 as the vertical Hall elements are sequentially selected.

Values of the resistors (R1, R2 . . . RN) of the digital potentiometer 722 may be selected according to the resistances of the selected vertical Hall element 600. Additionally it will be appreciated that the digital potentiometer 722 may include resistance value selection dependent on other resistance external to the digital potentiometer 722. The other resistance may correspond to resistance from a variety of different sources including, but not limited to power supply traces (or connections) that connect components (e.g., resistors, inductors, capacitors) to the magnetic field sensor 300.

In some embodiments, temperature coefficients of resistive elements 1, 2, 3, 4 are substantially the same as those of resistors (R1, R2 . . . RN) of the digital potentiometer 722. Keeping the temperature coefficients substantially the same allows for the various offset voltages of the vertical Hall elements within the CVH sensing element 302 of FIG. 3 to stay relatively unchanging over a temperature range, thereby reducing the temperature drift of the angle reading represented by the x-y angle signal (350a, FIG. 3).

It is to be appreciated that the circuit of FIG. 7C is provided as a non-limiting example and other equivalent circuits can be used to represent the same function.

Figure 8:
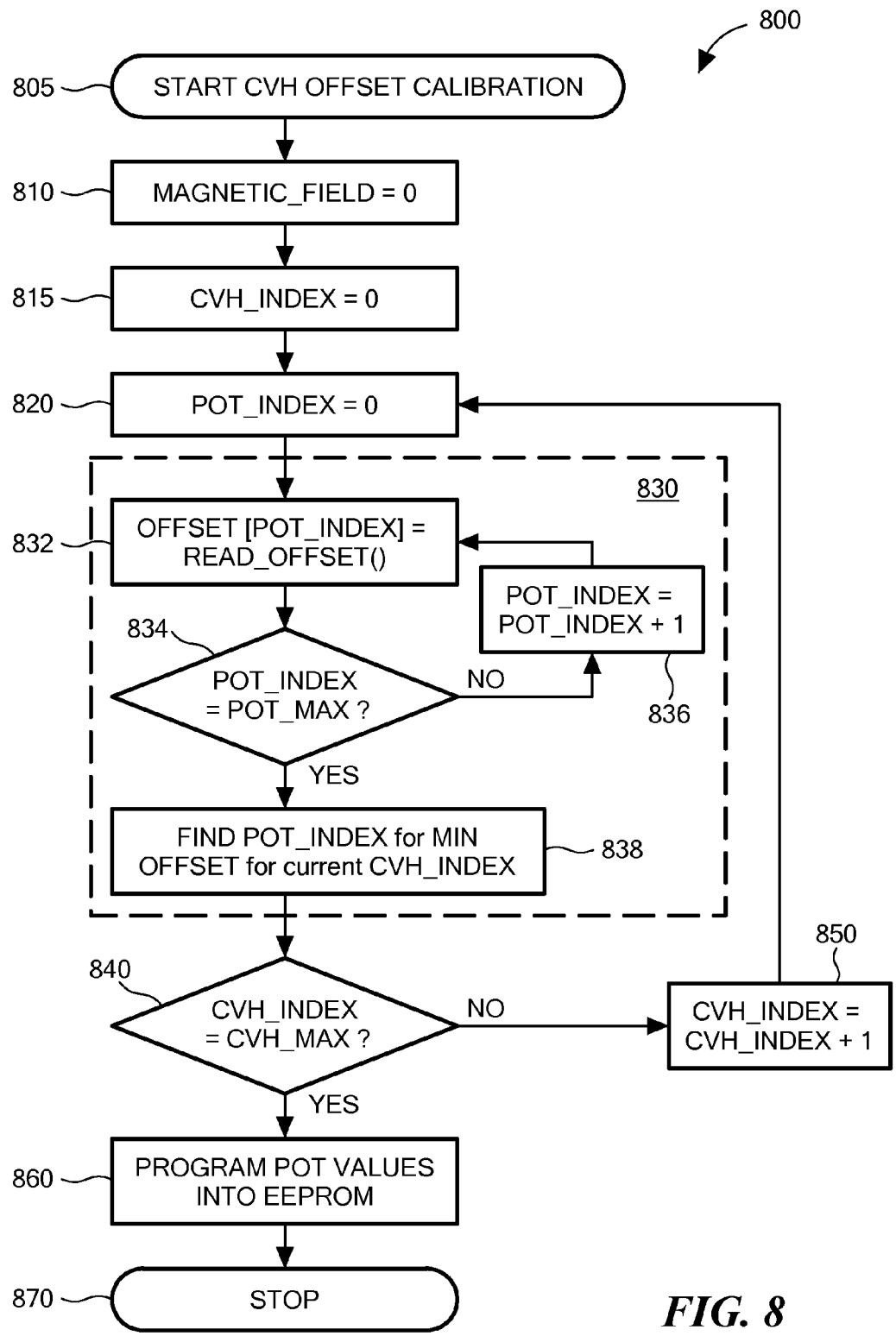
FIG. 8 is a flowchart illustrating an example CVH offset calibration method that may be applied to the magnetic field sensor of FIG. 3 for providing a magnetic field sensor with reduced offset.

Referring now to FIG. 8, shown is a flowchart corresponding to a CVH offset calibration method that can be implemented in magnetic field sensor 300 shown in FIG. 3, for example, and, more particularly, by way of a calibration module (e.g., 360 of FIG. 3). Rectangular elements (typified by element 810 in FIG. 8), herein denoted "processing blocks," represent computer software instructions or groups of instructions. Diamond shaped elements (typified by element 834 in. FIG. 8), herein denoted "decision blocks," represent computer software instructions, or groups of instructions, which affect the execution of the computer software instructions represented by the processing blocks.

The processing and decision blocks can represent steps performed by functionally equivalent circuits such as a digital signal processor circuit or an application specific integrated circuit (ASIC). The flow diagram does not depict the syntax of any particular programming language. Rather, the flow diagram illustrates the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the invention. Thus, unless otherwise stated the blocks described below are unordered meaning that, when possible, the steps can be performed in any convenient or desirable order.

As illustrated in FIG. 8, an exemplary CVH offset calibration method 800 begins at block 805 where a magnetic field sensor, which can be the same as or similar to magnetic field sensor 300 of FIG. 3, starts CVH offset calibration. As discussed above in conjunction with FIG. 2, an offset is characterized by an output signal from the CVH sensing element, or, more particularly an output signal from each of a plurality of vertical Hall elements of a CVH sensing element, not being representative of a zero magnetic field when the magnetic field sensor is experiencing a zero magnetic field. As described above, it is desirable to reduce the above-referenced offset.

The magnetic field sensor 300 disclosed herein, particularly a potentiometer system (e.g., 320, shown in FIG. 3) of the magnetic field sensor 300 disclosed herein, is configured to attenuate the offset of each one of the one or more magnetic field signals that are sequenced with the differential sequenced signal (e.g., 304a, 304b, shown in FIG. 3) to produce a magnetic field sensor (e.g., 300, shown in FIG. 3) with reduced offset The magnetic field sensor with reduced offset can, for example, be achieved by the calibration module 300 of FIG. 3 using the CVH offset calibration method 800 disclosed below.

It is to be appreciated that CVH offset calibration method 800 disclosed below can be performed in the factory at wafer level or at package level testing and calibration. It is also to be appreciated that, although CVH offset calibration method is described as being useful for providing offset calibration to a CVH sensing element, other magnetic field sensing elements, including other types of Hall effect elements, magnetoresistance elements, and magnetotransistor elements can also be used.

Returning now to method 800, at block 810, the magnetic field sensor (e.g., 300 of FIG. 3) is placed in a zero magnetic field environment. Such an environment can be achieved, for example, by magnetic shielding or the like.

At block 815, a CVH indexing value (CVH_INDEX) is set to zero. The CVH indexing value can, for example, be indicative of any arbitrary one of the plurality of vertical Hall elements within the CVH sensing element. Referring briefly to FIG. 3, the calibration sequence clock signal 360a, like the clock signal 308a, as discussed above, may control and/or indicate switching (or indexing) of the vertical Hall elements.

At block 820, a potentiometer index value (POT_INDEX) associated with a potentiometer (e.g., 322, shown in FIG. 3) of the potentiometer system (e.g., 320, shown in FIG. 3) of the magnetic field sensor 300 is set to zero (POT_INDEX=0), for example, by the calibration module 360 of FIG. 3, via the potentiometer control si 360b. The potentiometer index value (POT_INDEX) of zero can, for example, be indicative of an arbitrary one of a plurality of switch settings and/or offset attenuation factors associated with the potentiometer of the potentiometer system.

At block 832, the calibration module 360, via the ADC 362, reads the offset of the vertical Hall element of the CVH sensing element 302 associated with CVH_INDEX=0 and POT_INDEX=0.

At block 834, the magnetic field sensor determines whether the current potentiometer index value (POT_INDEX) is equal to a maximum potentiometer index value (POT_MAX). If the current potentiometer index value (POT_INDEX) is not equal to the maximum potentiometer index value (POT_MAX), the method proceeds to a block 836.

At block 836, the potentiometer index value (POT_INDEX) of the potentiometer is increased by a particular value which, for example, can be one (POT_INDEX=POT_INDEX+1). Subsequently, the process occurring in blocks 832 and 834 repeatedly loops for the same first one of the plurality of vertical Hall elements, using all possible values of the potentiometer index value (POT_INDEX), and resulting in the calibration module 360 capturing measured offset voltage values for each potentiometer setting for the one selected vertical Hall element within the CVH sensing element 300.

For example, in a second run through blocks 832 and 834 for the first one of the plurality of vertical Hall elements, the potentiometer applies a second offset attenuation factor associated with a second potentiometer index value (e.g., POT_INDEX=POT_INDEX+1) to the differential sequenced signal 304a, 304b of the first one of the plurality of vertical Hall elements to produce a second attenuated differential sequenced signal. The second potentiometer index value can, for example, be representative of an increased offset attenuation factor (e.g., lower measured offset voltage) associated with the digital potentiometer and an associated switch setting with the increased offset attenuation factor depending on the particular potentiometer utilized in the potentiometer system of the magnetic field sensor.

The number of times blocks 832, 834, and 834 of the attenuation processing segment 830 are repeated depends on the number of different offset attenuation factor selections (e.g., two hundred fifty six), specifically the maximum potentiometer index value (POT_MAX) associated with the potentiometer.

The maximum potentiometer index value (POT_MAX), in the case of a digital potentiometer, can be determined by the number of "digital bits" used for the selection of a desired offset attenuation factor, i.e., eight bits allows for two hundred fifty six different offset attenuation factor selections, ten bits allows for one thousand twenty four, etc. As such, an eight bit digital potentiometer can comprise two hundred fifty six different offset attenuation factor selections and two hundred fifty six potential potentiometer index values (POT_MAX=two hundred fifty six). In some embodiments, only a subset of the available potential potentiometer index values (e.g., one hundred twenty eight of two hundred fifty six) are used in method 800, providing for a lower maximum potentiometer index value (e.g., POT_MAX=one hundred twenty eight).

Once the maximum potentiometer index (POT_MAX) is detected at block 834, the process proceeds to block 838.

At block 838, the calibration module 360 determines which potentiometer index value (POT_INDEX) associated with the current CVH index value (CVH_INDEX), produces an attenuated differential sequenced signal 304a, 304b closest to zero. The determined "best" potentiometer index value (POT_INDEX) and the associated CVH index value (CVH_INDEX) can be stored at block 838 (or alternatively, at block 860 described below), for example, by the calibration module via signal 360c, in the memory device 326 (e.g., EEPROM) for later usage.

From inspection of the digital potentiometer 722 of FIG. 7, it will be understood that some number of lower potentiometer index values produce a differential signal between nodes b and d with an offset voltage that is on one side of zero, and some number of higher potentiometer index values produce a differential signal between nodes b and d with an offset voltage that is on the other side of zero. Thus, the index values are related to offset attenuation factors as used herein, as opposed to merely attenuation factors.

At block 840, the magnetic field sensor determines whether the current CVH index value (CVH_INDEX) is equal to the maximum CVH index value (CVH_MAX). If the current CVH index value (CVH_INDEX) is equal to the maximum CVH index value (CVH_MAX), the method proceeds to a block 850.

At block 850, the CVH index value (CVH_INDEX) is increased by a value (e.g., one), as represented by CVH_INDEX=CVH_INDEX+1, and the method returns to a block 820, where the potentiometer index value (POT_INDEX) is again initialized to zero. According to some embodiments, blocks 820, 830, and 840 are repeated until a "best" offset attenuation factor (i.e., produces an offset voltage closest to zero) is identified by the calibration module for every one of the vertical Hall elements within the CVH sensing element 302. For example, a CVH sensing element comprising sixty-four vertical Hall elements will generally have sixty-four best offset attenuation factors (i.e., one for each vertical Hall element).

At block 840, when the last vertical Hall element associated with the CVH index (i.e., CVH_MAX) has been processed, the CVH offset calibration method 800 subsequently proceeds to block 860.

At block 860, the "best" offset attenuation factor associated with each respective one of the differential sequenced signals produced by the plurality of vertical Hall elements can be programmed into the memory device 326, along with a respective CVH index value representative of a vertical Hall element to which the offset attenuation factor applies. The offset attenuation factors and other information stored in the memory can be accessed by the potentiometer system 320 while the magnetic field sensor 300 is in operation to provide for a magnetic field sensor with reduced offset. The CVH offset calibration method 800 ends at block 870.

In alternate embodiments, the attenuation processing segment 830 can instead use a binary search, algorithm or similar means. Using a binary search algorithm, for example, the attenuation processing segment 830 of method 800 can potentially be completed in fewer steps. For example, instead of simply increasing the potentiometer index value (POT_INDEX) by one in a block 836 (POT_INDEX=POT_INDEX+1), the potentiometer system can either increment or decrement the potentiometer index values (POT_INDEX) based on a comparison of a result of a measured offset associated with a first potentiometer index value (e.g., POT_INDEX=zero) and a measured offset associated with a second potentiometer index value (e.g., POT_INDEX=one hundred twenty seven (halfway between zero and two hundred fifty five)).

In each step, the binary search algorithm can compare two measured offset voltages and move the potentiometer index value (POT_INDEX) in a next measurement up or down, for example, half way between available up and down ranges to take the next measurement. The binary search algorithm can compare each measurement N with a prior measurement N−1 and can jump the potentiometer index value (POT_INDEX) half way up or down with each comparison, with each measurement measuring a lower offset voltage, arriving at a "best" offset voltage in fewer steps than all steps of digital potentiometer 322.

Figure 9:
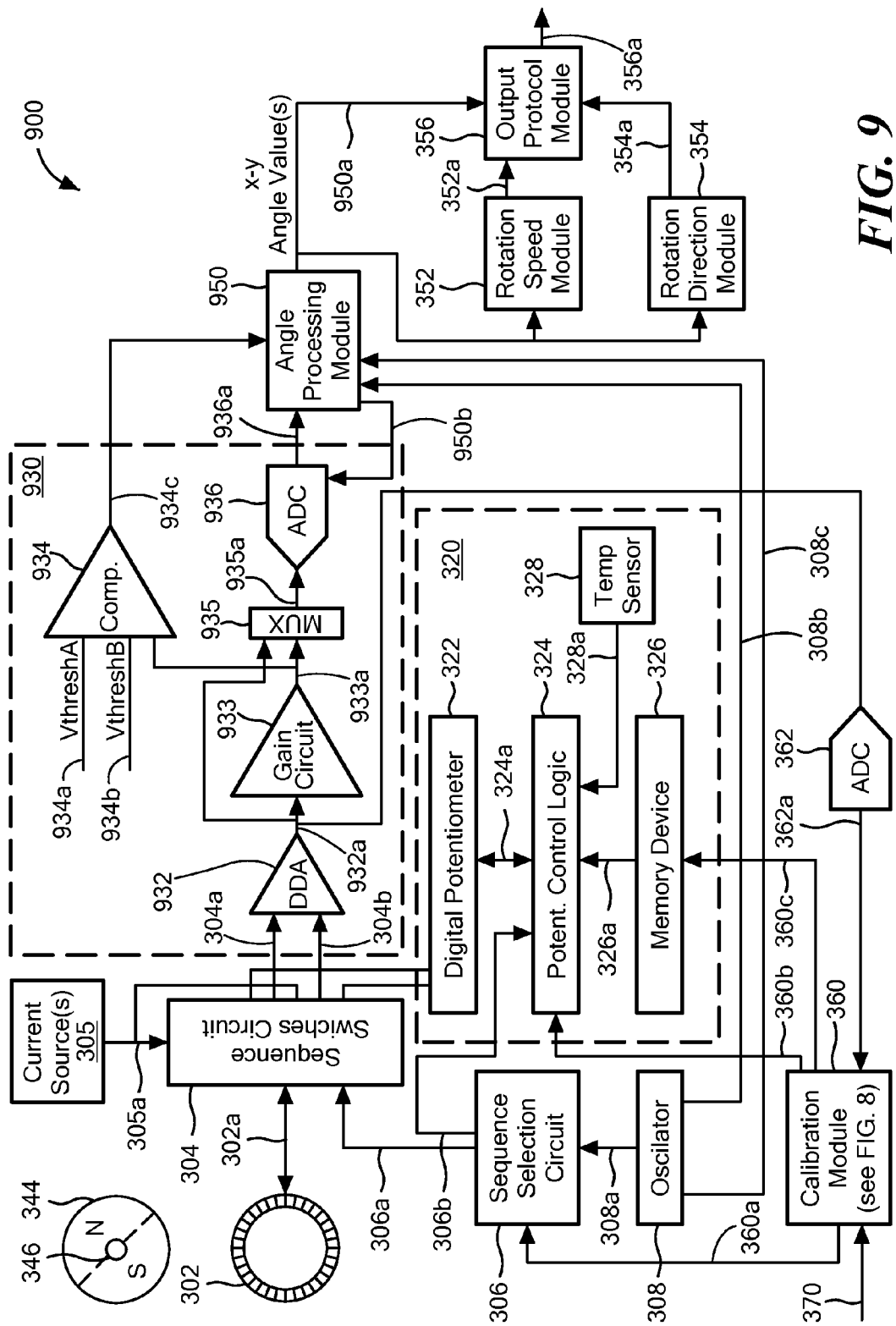
FIG. 9 is a block diagram of another example magnetic field sensor having a CVH sensing element, a digital potentiometer (or variable potentiometer) module with offset cancellation, but having a gain circuit that can achieve a high accuracy of the magnetic field sensor without a bandpass filter, and having a comparator.

Referring now to FIG. 9, in which like elements of FIG. 3 are shown having like reference designations, a magnetic field sensor 900 similar to the magnetic field sensor 300 of FIG. 3 is shown. Here, however, the magnetic Held sensor 900 has a signal processing system 930 that is different than the signal processing system 330 of FIG. 3. Additionally, the magnetic field sensor 900 has an angle processing module 950 that is different than the angle processing module 350 of FIG. 3.

The signal processing system 930, which includes a dual-input differential amplifier (DDA) 932, a gain circuit 933, a comparator 934, a multiplexer (MUX) 935, and an analog-to-digital converter (ADC) 936 in the example embodiment shown, can be coupled to an output of the sequence switches circuit 304. The signal processing system 930 has one or more inputs coupled to receive the differential sequenced signal 304a, 304b from an output the sequence switches circuit and is configured to process the differential sequenced signal 304a, 304b. The differential sequenced signal 304a, 304b, as discussed above in conjunction with FIG. 3, has been sequentially attenuated by operation of the potentiometer system 320. In one embodiment, the differential sequenced signal 304a, 304b is representative of an offset attenuated sequenced output signal.

The DDA 932 can be coupled to receive the differential sequenced signal 304a, 304b and configured to generate an amplified signal 932a. In some embodiments, the DDA 932 includes automatic gain control (AGC).

The gain circuit 933, which in some embodiments can include clamping of output signal levels, can be coupled to receive the amplified signal 932a and can have a gain selected such that the gain circuit 933 is configured to generate a clamped sequenced signal 933a having a predetermined number of samples between upper and lower clamping levels of the gain circuit 933. The clamping levels can, for example, be set through a zener-diode feedback path around the gain circuit 933 and be set such that the gain circuit 933 does not saturate at output levels of a power supply of the gain circuit 933, and therefore, the gain circuit 933 remains in linear operation even when the output reaches the clamping levels. In some other embodiments, however, it may be desirable to have clamping levels be substantially the same as or similar to a saturation level of the gain circuit 933. In some alternate embodiments, a gain of the gain circuit 933 is selected such that the clamped sequenced signal 933a is not clamped, but merely resides within the linear operating range of the gain circuit 933.

Additionally, in one aspect, the predetermined number of samples between the clamping levels is substantially less than half a number of the plurality of magnetic field sensing elements (i.e., vertical Hall elements) in the CVH sensing element 302. For example, in some embodiments, the predetermined number of samples in one quarter, one eighth, on sixteenth, or one thirty second of the number of vertical Hall elements.

In some embodiments, the ADC 362, which is coupled to the calibration, module 360, can also be coupled to receive the amplified signal 932a.

The comparator 934 can be coupled to receive the clamped sequenced output signal 933a, a first threshold voltage 934a (also denoted by $V_{thresh}A$), a second threshold voltage 934b (also denoted by $V_{thresh}B$), and configured to generate a comparison signal 934c. The MUX 935 can be coupled to receive the amplified signal 932a and the clamped sequenced output signal 933a and configured to generate a multiplexed signal 935a as a selected one of the amplified signal 932a or the clamped sequenced output signal 933a.

The ADC 936 can be coupled to receive the multiplexed signal 935a and configured to generate a converted digital signal 936a. In some embodiments, the gait of the gain circuit 933 is selected such that the multiplexed signal 935a received by the ADC 936a has a resolution that is substantially increased at or near a zero-crossing; i.e. the sample take relatively large amplitude steps. The ADC 936 can also be coupled to receive a control signal 950b from the angle processing module 950 and configured to operate in accordance with the control signal 950b as explained below.

The signal processing system 930, particularly the comparator 934 and the ADC 936 of the signal processing system 930, can be coupled to the angle calculation module 950.

The angle calculation module 950 can be coupled to receive the comparison signal 934a and the converted digital signal 936a and configured to generate the control signal 950b and an x-y angle signal 950a having x-y angle values indicative of the angle of the magnetic field generated by the magnet 344. The x-y angle signal 950a can be the same as or similar to the x-y angle signal 350a of FIG. 3. Additionally, the x-y angle signal 950a can change, and therefore, can be representative of a rotating magnetic field when the magnet 344 rotates.

The magnetic field sensor 900 can further include the rotation speed module 352, the rotation direction module 354, and the output protocol module 356, each described above in conjunction with FIG. 3, and each of which is coupled to receive and process the x-y angle signal 950a.

It should be noted that the signal processing system 930 does not include a bandpass filter like the bandpass filter 336 of FIG. 3. In first part, the signal processing system 930 depends upon signals within the signal processing system 930, e.g., the amplified signal 932a, already having low harmonic content without filtering by way of the potentiometer system 320, for reasons discussed above in conjunction with FIGS. 3-7C. However, in other embodiments, the signal processing system 930 can include a bandpass filter. In second part, the signal processing system uses the clamped sequenced output signal 933a and identifies zero or threshold crossings thereof.

Operation of the calibration module 360 is described more fully above in conjunction with FIGS. 3 and 8 and, therefore, is not discussed further herein.

As described above, the gain circuit 933, having an input coupled an output of the DDA 934, receives the amplified signal 932a and in response thereto generates a clamped sequenced output signal 933a at an output. In one embodiment, a gain (or gain factor) of the gain circuit 933, which may comprise a plurality of amplification stages coupled in series or parallel, is selected such that the amplified signal 932a is clamped (to produce the clamped sequenced output signal 933a). The gain (e.g., a gain of about three to about five) can, for example, be selected such that the amplified signal 932a is clamped at predetermined levels, for example, at +/−1.2 Volt clamping levels. In other embodiments, clamping levels greater than or less than +/−1.2 Volts can be used. In other embodiments, the gain is less than that which would achieve the clamping levels.

The gain can, for example, be predetermined in the design of the magnetic field sensor 900. The gain can also be dynamically configured, for example, at power-up of the magnetic field sensor 900 by a digital gain control circuit (not shown), analog gain control circuit (not shown), or a combination thereof.

As described above in conjunction with FIG. 3, a pointing direction of the magnetic field generated by the magnet 344 is determined. In accordance with a phase of a the signal 338a in relation to a phase of one of the signals 308b, 308c. Similarly, a pointing direction of the magnetic field is determined in accordance with a phase of the converted digital signal. 936a in relation to a phase of one of the signals 308b, 308c. It should be recognized that the phase of the clamped sequenced output signal 933a is represented by zero (or other) threshold crossings of the saturated signal 933a. When the MUX 935 is in a particular position, the converted signal 936a is representative of the clamped sequenced output signal 933a.

As described above, the MUX 935, having a first input coupled to an output of the DDA 932 and a second input coupled to an output of the gain circuit 933, receives the amplified signal 932a and the clamped sequenced output signal 933a at the first and second inputs, respectively, and in response thereto generates a multiplexed signal 935a as a selected one of the amplified signal 932a or the clamped sequenced output signal 933a. Operation of multiplexers (e.g., MUX 935) is conventional in the art and, therefore, is not described in detail herein.

As also described above, the ADC 936, having an input coupled to an output of the MUX 935, receives the multiplexed signal 935a and in response thereto generates the converted digital signal 936a which is substantially a digital representation of the multiplexed signal 935a.

In operation, the ADC 936, also having an input coupled to an output of the angle processing module 950, receives the control signal 950b and in response thereto adjusts a state of operation in accordance with the control signal 950b. The control signal 950b can, for example, be indicative of a processing state of the angle processing module 950. In one embodiment, the ADC input coupled to receive the control signal 950b operates as a binary switch to turn on the ADC 936 (or place the ADC 936 in a normal-power state) when the control signal 950b is a digital signal in a logic 1 state and to turn off the ADC 936 (or place the ADC 936 in a low-power state) when the control signal 950b is a digital signal in a logic 0 state. The control signal 950b may be an analog signal or a mixed signal (combination of analog and digital signal) in other embodiments. The ADC 936 can, for example, be a 10-bit ADC which can generate a complete 10-bit sample for each CVH index, i.e., for each vertical Hall element within the CVH sensing element 302.

As described above, the comparator 934 receives the first threshold voltage 934a, the second threshold voltage 934b, and the clamped sequenced output si al 933a at respective inputs. The comparator 934, in response to receiving the first threshold voltage 934a, the second threshold voltage 934b, and the clamped sequenced output signal 933a, generates the comparison signal 934c at an output.

In operation, the comparison signal 934c can, for example, have a bit pattern (i.e. a pattern of logic 0's and 1's). In one embodiment, the comparison signal 934c provides an indication of whether the clamped sequenced output signal 933a is within upper and/or lower threshold limits set by the first threshold voltage 934a and/or the second threshold voltage 934b. In another embodiment, the comparison signal 934c provides an indication of whether the clamped sequenced output signal 933a is near a zero-crossing (or other threshold crossing).

In one embodiment, the comparator 934 can be an inverting window comparator having an upper limit (or upper trip voltage) of; for example, +0.75V (e.g., set by the first threshold voltage 934a or the second threshold voltage 934b) and a lower limit (or lower trip voltage) of, for example, −0.75V (e.g., set by the second threshold voltage 934b or the first threshold voltage 934a). In such embodiment, the clamped sequenced output signal 933a on the inverting input can be between the lower limit and the upper limit in order for the comparison signal 934c to output logic 1. Additionally, in such embodiment, the clamped sequenced output signal 933a on the inverting input cannot be between the lower limit and the upper limit in order for the comparison signal 934c to output logic 0.

In another embodiment, the comparator 934 can be a non-window comparator having an upper limit (e.g., set by the first threshold voltage 934a or the second threshold voltage 934b) and a lower limit (e.g., set by the second threshold voltage 934b or the first threshold voltage 934a), which are closely spaced in voltage to achieve hysteresis noise immunity. In such embodiment, the clamped sequenced output signal 933a on the inverting input can be above the upper limit in order for the comparison signal 934c to output logic 1. Additionally, in such embodiment, the clamped sequenced output signal 933a on the inverting input can be below the lower limit in order for the comparison signal 934c to output logic 0.

The first and second threshold voltages 934a, 934b can be selected based on various factors, such as available voltage levels on the magnetic field sensor 900 and/or external supply voltage levels (VCC). The first and second threshold voltages 934a, 934b can be fixed voltages, as may be available on the magnetic field sensor 900, and may be set independently of one another to be symmetrical about zero volts (or a bias voltage) or not symmetrical about zero volts, for example, in accordance with a range of the ADC 936.

As described, above, the angle processing module 950, in response to receiving the converted digital signal 936a, the comparison signal 934a, and clock signals 308b, 308c, generates the control signal. 950b and the x-y angle signal 950a. In one embodiment, the control signal 950b is indicative of an operating state of the angle processing module 950.

In operation, a control signal 950b of logic 1, for example, may be representative of an active state of the angle processing module 950 where the angle processing module 950 is performing signal processing operations. During the active state of the angle processing module 950, the ADC 936 can be operational by way of the logic 1 control signal 950b. In contrast, a control signal 950b of logic 0, for example, may be representative of an inactive state of the angle processing module 950 where the angle processing module 950 is not performing signal processing operations. During the inactive state of the angle processing module 950, the ADC 936 can be powered off or be put in a low power state by way of the logic 0 control signal 950b.

Figure 10:
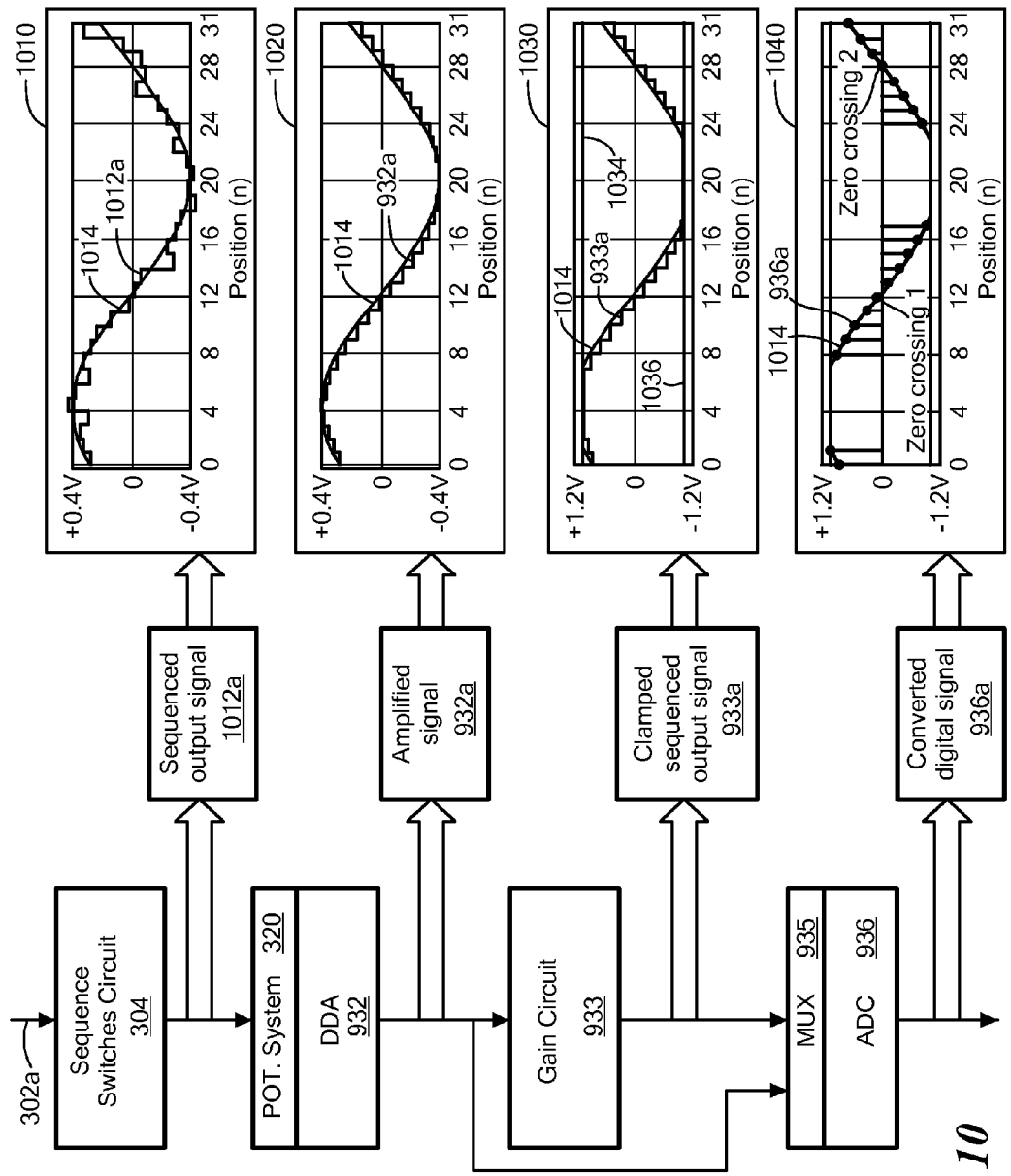
FIG. 10 is a set of graphs illustrating example output signals of select components of the example magnetic field sensor of FIG. 9.
Figure 10A:
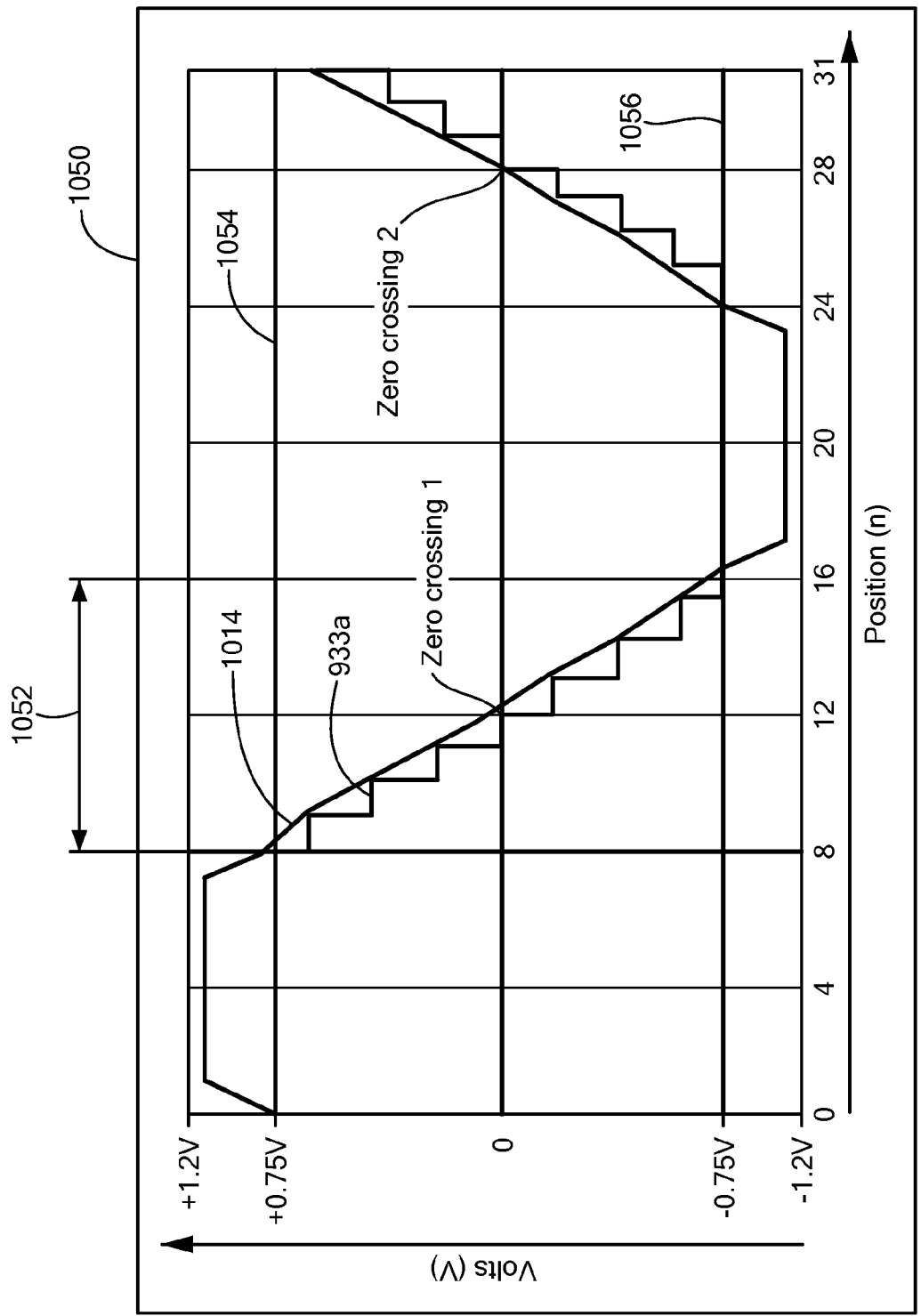
FIG. 10A is a graph illustrating example inputs signal of the comparator of FIG. 9.

Operation of the angle processing module 950 is discussed further in conjunction with FIGS. 10 and 10A, but let it suffice to say that the x-y angle signal 950a would have a larger error component were it not for operation of the potentiometer system 320 and the signal processing system 930.

The x-y angle signal 950a can be received by one or more of a rotation speed module 352, a rotation direction module 354, and an output protocol module 356 for further processing. Operation of the rotation speed module 352, the rotation direction module 354, and the output protocol module 356 are discussed above in conjunction with FIG. 3, for example, and therefore, are not described in further detail here.

Additional aspects of the concepts, systems, circuits and techniques described in FIG. 9 will be apparent from the subsequent figures.

Referring now to FIG. 10, in which like elements of FIGS. 9 are shown having like reference designations, illustrated are example output signals produced by various elements of the magnetic field sensor 900 of FIG. 9. It is to be appreciated that although units are shown in a plurality of graphs (1010, 1020, 1030, 1040) of FIG. 10. FIG. 10 is used for illustration purposes and may not be drawn to scale.

The plurality of graphs (1010, 1020, 1030, 1040) have a horizontal, axis, each with a scale in units of CVH vertical Hall element position, n, around a CVH sensing element, for example, the CVH sensing element 302 of FIG. 9. The plurality of graphs (1010, 1020, 1030, 1040) also each have respective vertical axes with scales in amplitude in units of volts (V). The vertical axis is representative of output signal levels from the plurality of vertical Hall elements of the CVH sensing element taken sequentially, one at a time, about the ring of contacts of the CVH sensing element. Each of the plurality of graphs (1010, 1020, 1030, 1040) includes a signal 1014, which shows ideal behavior of signals representative of output signal levels from the plurality of vertical Hall elements of the CVH taken with the magnetic field of FIG. 1 pointing in a direction of forty-five degrees.

Signal 1012a of graph 1010 represents an un-attenuated sequenced output signal generated by the sequence switches circuit 304. The sequenced switches circuit 304 receives a plurality of magnetic field signals 302a from the CVH sensing element (e.g., 302 of FIG. 9), one at a time, and generates the am-attenuated sequenced output signal 1012a in response thereto. The un-attenuated sequenced output signal 1012a is representative of sequentially selected ones of the plurality of magnetic field signals, each magnetic field signal generated by a respective one of a plurality of magnetic field sensing elements, e.g., the plurality of vertical Hall elements within a CVH sensing element. As illustrated, the un-attenuated differential sequenced output signal 1012a would have variations due to vertical Hall element offsets, were it not for operation of the attenuation system 320. As described above, the variation would tend to cause corresponding variations of output signals each being either to be too high or too low relative to the sine wave 1014, in accordance with offset errors for each element. As discussed above, such offset errors are undesirable.

Signal 932a of graph 1020 represents an amplified signal generated by the DDA 932. The DDA 932 receives a differential sequenced signal, which has been sequentially attenuated by operation of the potentiometer system 320 in the example embodiment shown (see, e.g., FIG. 9), and generates the amplified signal 932a in response thereto. As illustrated, the amplified signal 932a still has variations due to vertical Hall element offsets, but the variations are reduced in comparison to the un attenuated sequenced output signal 1012a.

Signal 933a of graph 1030 represents a clamped sequenced output signal generated by the gain circuit 933. The gain circuit 933 receives the amplified signal 932a and generates a clamped sequenced output signal 933a in response thereto. The clamped sequenced output signal 933a is shown being amplified by a gain of about three and being clamped at upper and lower clamping levels 1036, 1036, e.g., +/−1.2 Volts. In the example embodiment shown, a gain of three is sufficient to saturate and clamp the sequenced output signal. (i.e., sufficient to make the sequenced output signal 933a hit the upper and lower clamping levels 1034, 1036). In some embodiments, the gain can be greater than three to achieve clamping. In other embodiments, the gain can be less than or equal to three to achieve clamping.

Signal 936a of graph 1040 represents a converted digital signal generated by the ADC 936. As described above, the ADC 936 receives a multiplexed signal (e.g., 935a), which is a selected one of the amplified signal 932a or the clamped sequenced output signal 933a, from MUX 935 and generates the converted digital signal 936a in response thereto. In the example embodiment shown, the converted digital signal 936a is substantially a sampled digital representation of the clamped sequenced output signal 933a (i.e., the multiplexed signal is substantially the same as the clamped sequenced output signal 933a). Accordingly, the converted digital signal 936a is shown as being clamped at the upper and lower clamping levels 1036, 1036, e.g., +/−1.2 Volts. As described above, the converted digital signal 936a is received at an input of an angle processing module, which can be the same as or similar to angle processing module 950 of FIG. 9.

Referring now FIG. 10A graph 1050, like the plurality of graphs (1010, 1020, 1030, 1040) of FIG. 10, has a horizontal axis with a scale in units of CVH vertical Hall element position, n, around a CVH sensing element, for example, the CVH sensing element 302 of FIG. 9. Additionally, graph 1050, like the plurality of graphs (1010, 1020, 1030, 1040) of FIG. 10, has a vertical axis with a scale in amplitude in units of volts (V). Graph 1050 includes a clamped sine wave 1014a which shows ideal behavior of signals representative of output signal levels from the plurality of vertical Hall elements of the CVH taken with the magnetic field of FIG. 1 pointing in a direction of forty-five degrees and clipped at the predetermined upper and lower clamping levels 1034, 1036, e.g., +/−1.2 Volts.

Signal 933a of graph 1050 represents the clamped sequenced output signal of FIG. 9 as received by a comparator, which can be the same as or similar to comparator 934 of FIG. 9. The comparator 934 has a first threshold voltage, as denoted by reference numeral 1054, and a second threshold voltage, as denoted by reference numeral 1056. The first threshold voltage (or upper trip voltage) 1054 can be the same as or similar to the first threshold voltage 934a of FIG. 9 (e.g., +0.75V) and the second threshold voltage (or lower trip voltage) 1056 can be the same as or similar to the second threshold voltage 934b of FIG. 9 (e.g., −0.75V). The comparator 934 receives the clamped sequenced output signal 933a, the first threshold voltage 1054, and the second threshold voltage 1056, and generates a comparison signal (e.g., 934c) in response thereto.

The comparison signal can, for example, have a bit pattern (i.e., a pattern of logic 0's and 1's) representative of values of the clamped sequenced output signal 933a received by the comparator. In one embodiment, the comparison signal provides an indication of whether the clamped sequenced output signal 933a is within or between the threshold limits set by the first threshold voltage 1054 and/or the second threshold voltage 1056, as denoted by reference numeral 1052. In another embodiment, the comparison signal provides an indication of whether the clamped sequenced output signal 933a is near a zero-crossing, as denoted by zero-crossing 1 and zero-crossing 2.

The comparison signal (e.g., 934c) can be received by an angle processing module which is the same as or similar to the angle processing module 950 of FIG. 9. In one embodiment, signal acquisition by the angle processing module occurs only when the clamped sequenced output signal 933a is between the first threshold voltage 1054 and the second threshold voltage 1056. As described above, the phase of the comparison signal 934c is determined by time positions of zero-crossings.

By stopping signal acquisition when the signal is outside of the upper and lower thresholds, power reduction may be achieved in the angle processing module and/or the ADC (e.g., ADC 936 of FIG. 9) coupled to the angle processing module. As discussed above, the angle processing module 950 of FIG. 9 is capable of providing the control signal 950b to the ADC 936 indicative of an operating state (e.g. active or inactive) of the angle processing module 950. In one embodiment, the control signal 950b is associated with the comparison signal. In one embodiment, the control signal 950b is additionally associated with clock signals 308b, 308c of FIG. 9) received by the angle processing module.

In one embodiment, the x-y angle signal 950a of FIG. 9 is calculated through analysis of time positions of zero-crossings of the converted digital signal 936a received from the ADC (e.g., ADC 936 of FIG. 1).

Returning briefly to FIG. 10, particularly graph 1040 of FIG. 10, the angle processing module 950 may, for example, calculate the x-y angle signal 950a by linear interpolation of a predetermined number of steps (e.g., 3 steps) of the converted digital signal 936a (i.e., with each step corresponding to a signal at a CVH vertical Hall element position, n, around the CVH sensing element) above and below the zero-crossing (e.g., above and below zero-crossing 1 and/or zero-crossing 2). An example linear interpolation is given by the equation:

$$(360 \text{ degrees/number of CVH vertical Hall element positions around the CVH sensing element}) \times (U1/(U1-U2)), \quad (1)$$

where; 360 degrees/number of CVH vertical Hall element positions around the CVH sensing element=angular separation between two closest vertical Hall element contacts of two adjacent vertical Hall elements in the CVH sensing element;

U1 is representative of a sum of a selected number of samples (e.g., 3 samples) of the converted digital signal 936*a* on one side (e.g., right side) of the zero-crossing (e.g., zero-crossing 1 and/or zero-crossing 2); and U2 is representative of a sum of a selected number of samples (e.g., 3 samples) of the converted digital signal 936*a* on another side (e.g., left side) of the zero-crossing (e.g., zero-crossing 1 and/or zero-crossing 2).

In some embodiments, U1 and/or U2 are each representative of one respective sample, e.g., a sample to the right of the threshold (e.g., zero) crossing, and the other a sample to the left of the threshold crossing. However, in other embodiments, U1 and U2 can each be a respective sum of samples to the right of and to the left of the threshold, wherein each sum includes more than one sample, for example, 2, 3, 4, 5, or 10 samples.

For example, a sixty-four element CVH sensing element with a sum of the samples to the right of the zero-crossing (e.g., zero-crossing 1) equaling five (e.g., U1) and a sum of the samples to the left of the zero-crossing (e.g., zero-crossing 1) equaling five-point-five (e.g., U2), the linear interpolation can be given by (360 degrees/64)×(545+5.5)), which equals approximately 2.68 degrees. In this example, the x-y angle signal 950*a* can be calculated as 2.68 degrees between the angular distance between two consecutive vertical Hall elements. In one example embodiment, by knowing that the angle is between about 45.0 degrees and about 50.625 degrees (angular separation between contacts of two adjacent vertical Hall elements when there are sixty four contacts), the absolute angle can, for example, be computed as about 45.0 plus about 2.68 degrees to equal about 47.68 degrees.

In one embodiment, accuracy of the x-y angle signal 950*a* can be improved by linear interpolating a greater number of steps (e.g., 4 vs. 3). The number of steps can, for example, be increased by using a high-resolution ADC (e.g., 10-bit ADC) to generate the converted digital signal 936*a*. Generally, the higher the resolution of the ADC, the greater number of converted digital signals 936*a* that will exist for each step corresponding to a signal at a CVH vertical Hall element position, n, around the CVH sensing element.

The accuracy of the x-y angle signal 950*a* can also be improved by decreasing a distance between each of the steps. For example, in sonic embodiments having a gain circuit 933 with a gain factor of three may provide a more accurate x-y angle signal than having a gain circuit 933 with a gain factor of ten. In other embodiments, the opposite may be true. The angle processing module may also use the phase of the clocks signals (e.g., 308*b*, 308*c*) in computing the x-y angle signal 950*a*.

In alternate embodiments, the angle processing module 950 can instead use a binary search algorithm or similar means for calculating the x-y angle signal 950*a*. Using a binary search algorithm, for example, the x-y angle signal 950*a* can potentially be computed in fewer steps, particularly without a need to cycle through each of the plurality of magnetic field sensing elements (e.g., vertical Hall elements) of the CVH sensing element (e.g., 302, shown in FIG. 9) to compute the x-y angle signal 950*a*. In one example implementation of a binary search algorithm, first the x-y angle signal 950*a* can, for example, be computed by finding signal values, S1 and S2, for two selected indexes (e.g., vertical Hall element one and vertical Hall element eight) of the CVH sensing element 302, and interpolating the samples of S1 and S2 using the above techniques. According to some embodiments, when. S1 is greater than zero (S1>0) and S2 is less than zero (S2<0) for two selected indexes, such is indicative of a zero-crossing being located between S1 and S2, and therefore, between the two indexes of vertical Hall elements.

Taking the CVH sensing element 302 of magnetic field sensor 900 discussed above in conjunction with. FIG. 9 as an example, in a first sequential step of an example implementation of a binary search algorithm, the sequence switches circuit (e.g., 304, shown in FIG. 9) can, for example, sequentially select a first vertical Hall element (i.e. a first index) from among the plurality of vertical Hall elements as a first selected magnetic field sensing element (e.g., a magnetic field sensing element with an index value of zero) and, using the first selected magnetic field sensing element, calculate a signal value S1.

In a second sequential step, the sequence switches circuit can, for example, select a second vertical Hall element (i.e., a second index) from among the plurality of vertical Hall elements as a second selected magnetic field sensing element and, using the second selected magnetic field sensing element, calculate a signal value S2. It is then is determined if S1, S2, or both S1 and S2 are greater than or less than zero. Depending upon the values of S1 and S2, it can be known if the zero crossing (i.e., vertical Hall element with a near zero output) is between the first and second selected vertical Hall elements.

Assuming the CVH sensing element 302 comprises sixty-four vertical Hall elements, the first selected magnetic field sensing element can be a sequential first vertical Hall element (e.g., index zero) and the second selected magnetic field sensing element can be a vertical Hall element that is spaced apart from the first selected vertical Hall element by a first predetermined number of vertical Hall elements (e.g., index thirty-one), which, according to some embodiments, is thirty two vertical. Hall elements apart. The predetermined number of vertical Hall elements can also be represented by a distance in degrees around the CVH sensing element 302. Taking the CVH sensing element 302 comprising sixty-four vertical Hall elements as an example, a second selected vertical Hall element that is spaced apart from a first selected vertical Hall element by thirty-two vertical Hall elements is also spaced apart from the first selected vertical Hall element by one hundred eighty degrees. It should, of course, be appreciated the second selected vertical Hall element can be spaced apart from the first selected vertical Hall element by a predetermined number of vertical Hall elements that is greater than or less than thirty-two vertical Hall elements and greater than or less than one hundred eighty degrees.

In one aspect, the number of potential steps required for computing the x-y angle si at 950*a* is substantially proportional to the first predetermined number of vertical Hall elements (i.e., a greater spacing between the first and second selected vertical Hall elements for the above-described first and second sequential steps can result in a greater number of steps in computing the x-y angle signal 950*a*).

Returning now to the binary search algorithm, in a third sequential step, the signal values, S1 and S2, from the first and second selected vertical Hall elements, can be inspected. If polarities of the signal values, S1 and S2, are opposite, then it is known that a zero crossing must occur for a vertical Hall element between the first selected vertical Hall element and the second selected vertical Hall element and whether the desired direction of zero crossing is between zero and one hundred eighty degrees around the CVH sensing element or between one hundred eighty and three hundred sixty degrees around the CVH sensing element.

If it is determined that the zero crossing (i.e., vertical Hall element with substantially zero output) does occur between the first and second selected vertical Hall elements, and if the signal values, S1 and S2, from the first and second selected vertical Hall elements are inside of the above described clamping levels, then the signal values, S1 and S2, can be interpolated to determine the zero crossing, which is related to the angle of the sensed magnetic field.

If it is determined that the zero crossing (i.e., vertical Hall element with substantially zero output) does not occur between the first and second selected vertical Hall elements, or if one of or both of the signal values, S1 and S2, are outside of the clamping levels, then in a fourth sequential step, the sequences switches circuit 304 of FIG. 9 can select a third selected vertical Hall element and compare a third signal value, S3, from the third selected vertical Hall element with the signal values, S1 and S2, to determine if the desired zero crossing occurs for a vertical Hall element between the first selected vertical Hall element and the third selected vertical Hall element or for a vertical Hall element between the second selected vertical Hall element and the third selected vertical Hall element.

If it is determined that that the zero crossing (i.e., vertical Hall element with substantially zero output) does occur between the first and third selected vertical Hall elements or between the second and third selected vertical Hall elements, and if signal values, S1 and S3 or S2 and S3, accordingly, are inside of the above described clamping levels, then interpolation of the signal values, S1 and S3 or S2 and S3, can be used to determine the zero crossing, which is related to the angle of the sensed magnetic field.

If it is determined that the zero crossing vertical Hall element with substantially zero output) does not occur between the first and third selected vertical Hall elements or between the second and third selected vertical Hall elements, or if one of or both of the signal values, S1 and S3 or S2 and S3, are outside of the clamping levels, then the binary search algorithm can continue with a fourth selected vertical Hall element, and possibly with more selected vertical Hall elements, until two vertical Hall elements are found that are on opposite sides of the zero crossing with a desired direction (slope) of zero crossing, and for which signal levels are within the above-described clamping levels. When such two vertical Hall elements are found, interpolation can be used to find the zero crossing.

As described above and will be appreciated by one of skill in the art, embodiments of the disclosure herein may be configured as a system, method, or combination thereof. Accordingly, embodiments of the present disclosure may be comprised of various means including entirely of hardware, entirely of software, or any combination of hardware and software. Furthermore, embodiments of the present disclosure may take the form of a computer program product on a computer-readable storage medium having computer readable program instructions (e.g., computer software) embodied in the storage medium. Any suitable non-transitory computer-readable storage medium may be utilized.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
a plurality of magnetic field sensing elements, each one of the plurality of magnetic field sensing elements having a respective plurality of contacts, wherein the plurality of magnetic field sensing elements is configured to generate a plurality of magnetic field signals, each magnetic field signal responsive to a magnetic field;
a sequence switches circuit coupled to the plurality of magnetic field sensing elements, wherein the sequence switches circuit is coupled to receive a control signal and, in response to the control signal, the sequence switches circuit is configured to sequentially select from among the plurality of magnetic field signals to generate a sequenced output signal representative of sequentially selected ones of the plurality of magnetic field signals;
a memory device configured to store a plurality of potentiometer control values; and
a variable potentiometer coupled to the sequence switches circuit, wherein the variable potentiometer is configured to attenuate an offset of each one of the plurality of magnetic field signals within the sequenced output signal by using a respective plurality of offset attenuation factors responsive to one or more of the plurality of potentiometer control values to generate an offset attenuated sequence output signal, wherein each one of the plurality of offset attenuation factors is related to a respective error voltage of a respective one of the plurality of magnetic field signals; and
a gain circuit coupled to receive a signal representative of the offset attenuated sequenced output signal, wherein the gain circuit has a gain selected such that the gain circuit is configured to generate a clamped sequenced output signal having a predetermined number of samples between clamping levels of the gain circuit, wherein the predetermined number is substantially less than half a number of the plurality of magnetic field sensing elements in the magnetic field sensor.

2. The magnetic field sensor of claim 1, wherein the variable potentiometer comprises a plurality of resistors having temperature coefficients selected in accordance with a temperature coefficient of at least one of the error voltages of a respective at least one of the plurality of magnetic field signals.

3. The magnetic field sensor of claim 1, wherein the variable potentiometer comprises a plurality of resistors having temperature coefficients selected in accordance with an average of temperature coefficients of the error voltages of the plurality of magnetic field signals.

4. The magnetic field sensor of claim 1, wherein each one of the plurality of potentiometer control values is also related to a respective error voltage of a respective one of the plurality of magnetic field signals.

5. The magnetic field sensor of claim 1, wherein each one of the plurality of potentiometer control values is selected based upon a measurement of a respective error voltage of a respective one of the plurality of magnetic field signals when the magnetic field sensor is in the presence of zero magnetic field.

6. The magnetic field sensor of claim 1, wherein the error voltage associated with each sequentially selected one of the plurality of magnetic field sensing elements comprises a respective offset voltage component.

7. The magnetic field sensor of claim 1, wherein the gain circuit is configured to amplify the signal representative of the offset attenuated sequenced output signal by a factor of about three to about five.

8. The magnetic field sensor of claim 1, further comprising:
an analog-to-digital converter (ADC) coupled to receive a signal representative of the saturated sequenced output signal, wherein the ADC is configured to generate a converted digital signal.

9. The magnetic field sensor of claim 8, wherein each converted digital signal is associated with a respective one of the plurality of magnetic field signals.

10. The magnetic field sensor of claim 8, further comprising:
an angle calculation module coupled to receive a signal representative of the converted digital signal, wherein the angle calculation module is configured to generate an x-y angle value representative of an angle of the magnetic field.

11. The magnetic field sensor of claim 10, wherein the x-y angle value is computed in accordance with a detected zero-crossing.

12. The magnetic field sensor of claim 10, wherein the x-y angle value is computed using a binary search algorithm.

13. The magnetic field sensor of claim 1, further comprising:
a comparator coupled to receive a signal representative of the saturated sequenced output signal, wherein the comparator is configured to generate a comparison signal.

14. The magnetic field sensor of claim 13, further comprising:
an angle calculation module coupled to receive a signal representative of the comparison signal, wherein power usage associated with the angle calculation module is determined in accordance with a state of the comparison signal.

15. The magnetic field sensor of claim 1, wherein the memory device comprises an EEPROM.

16. The magnetic field sensor of claim 1, wherein the plurality of magnetic field sensing elements comprise vertical Hall elements contained within a CVH sensing element.

17. The magnetic field sensor of claim 1, wherein the plurality of magnetic field sensing elements comprises a plurality of vertical Hall elements.

18. The magnetic field sensor of claim 1, wherein the signal representative of the offset attenuated sequenced output signal is an un-filtered signal.

19. A method, comprising:
generating a plurality of magnetic field signals with a plurality of magnetic field sensing elements, each one of the plurality of magnetic field sensing elements having a respective plurality of contacts, wherein each magnetic field signal is responsive to a magnetic field;
sequentially selecting from among the plurality of magnetic field sensing elements, in response to a control signal, to generate a sequenced output signal representative of sequentially selected ones of the plurality of magnetic field signals;
storing, in a memory device, a plurality of potentiometer control values;
attenuating an offset of each one of the plurality of magnetic field signals within the sequenced output signal by using a respective plurality of offset attenuation factors responsive to one or more of the plurality of potentiometer control values associated with a variable potentiometer to generate an offset attenuated sequenced output signal, wherein each one of the plurality of offset attenuation factors is related to a respective error voltage of a respective one of the plurality of magnetic field signals; and
generating a clamped sequenced output signal from a signal representative of the offset attenuated sequenced output signal, wherein the clamped sequenced output signal has a predetermined number of samples between clamping levels of a gain circuit configured to generate the clamped sequenced output signal, wherein the predetermined number is substantially less than half a number of the plurality of magnetic field sensing elements in the magnetic field sensor.

20. The method of claim 19, wherein each one of the plurality of potentiometer control values is also related to a respective error voltage of a respective one of the plurality of magnetic field signals.

21. The method of claim 19, wherein each one of the plurality of potentiometer control values is selected based upon a measurement of a respective error voltage of a respective one of the plurality of magnetic field signals when the magnetic field sensor is in the presence of zero magnetic field.

22. The method of claim 19, wherein the error voltage associated with each sequentially selected one of the plurality of magnetic field sensing elements comprises a respective offset voltage component.

23. The method of claim 19, wherein the signal representative of the offset attenuated sequenced output signal is amplified by a factor of about three to about five.

24. The method of claim 19, further comprising:
generating a converted digital signal associated with a signal representative of the saturated sequenced output signal.

25. The method of claim 24, wherein the converted digital signal is further associated with a respective one of the plurality of magnetic field signals.

26. The method of claim 24, further comprising:
receiving a signal representative of the converted digital signal; and
generating an x-y angle value representative of an angle of the magnetic field in response to the signal representative of the converted digital signal.

27. The method of claim 26, wherein the x-y angle value is computed in accordance with a detected zero-crossing.

28. The method of claim 26, wherein the x-y angle value is computed using a binary search algorithm.

29. The method of claim 19, further comprising:
receiving a signal representative of the saturated sequenced output signal at an input of a comparator; and
generating a comparison signal in response to the signal representative of the saturated sequenced output signal.

30. The method of claim 29, further comprising:
receiving a signal representative of the comparison signal at an input of an angle calculation module,
adjusting power usage associated with the angle calculation module in accordance with a state of the comparison signal.

31. The method of claim 19, wherein the plurality of magnetic field sensing elements comprise vertical Hall elements contained within a CVH it sensing element.

32. The method of claim 19, wherein the plurality of magnetic field sensing elements comprises a plurality of vertical Hall elements.

33. The method of claim 19, further comprising:
generating a temperature signal representative of a temperature of the magnetic field sensor; and
selecting from among the plurality of potentiometer control values and generating the plurality of attenuation factors in accordance with the temperature signal.

* * * * *

UNITED STATES PATENT AND TRADEMARK OFFICE
CERTIFICATE OF CORRECTION

| | | |
|---|---|---|
| PATENT NO. | : 9,638,766 B2 | Page 1 of 5 |
| APPLICATION NO. | : 14/551905 | |
| DATED | : May 2, 2017 | |
| INVENTOR(S) | : Aurelian Diaconu | |

It is certified that error appears in the above-identified patent and that said Letters Patent is hereby corrected as shown below:

Abstract, Line 4 delete "sisal" and replace with --signal--.

Column 1, Line 30 delete ", and angle" and replace with --, an angle--.

Column 1, Line 37 delete "to magnetic" and replace with --to a magnetic--.

Column 1, Line 40 delete "to magnetic" and replace with --to a magnetic--.

Column 1, Line 46 delete "PCT/EP2008056517," and replace with --PCT/EP2008/056517,--.

Column 1, Line 62 delete "magnetic sensing" and replace with --magnetic field sensing--.

Column 2, Line 24 delete "accuracy, it" and replace with --accuracy. It--.

Column 4, Line 10 delete "offset." and replace with --offset;--.

Column 4, Line 20 delete "inputs signal" and replace with --input signals--.

Column 4, Line 36 delete "isotropic" and replace with --anisotropic--.

Column 4, Line 60 delete "terra" and replace with --term--.

Column 5, Line 22 delete "(ARC)," and replace with --(ASIC),--.

Column 5, Line 58 delete "CM" and replace with --CVH--.

Column 6, Line 3 delete "can" and replace with --can be--.

Column 6, Line 4 delete "of vertical" and replace with --of a vertical--.

Signed and Sealed this
Thirtieth Day of October, 2018

Andrei Iancu
*Director of the United States Patent and Trademark Office*

CERTIFICATE OF CORRECTION (continued)
U.S. Pat. No. 9,638,766 B2

Column 6, Line 8 delete "CVH can" and replace with --CVH sensing element can--.

Column 6, Lines 12 to 13 delete "CVH 12." and replace with --CVH sensing element 12.--.

Columns 6, Line 40 delete "CVH," and replace with --CVH--.

Column 6, Line 42 delete "graph. 50" and replace with --graph 50--.

Column 6, Line 50 delete "CVH taken" and replace with --CVH sensing element taken--.

Column 6, Line 55 delete "exemplar" and replace with --exemplary--.

Column 6, Line 67 delete "position. 4" and replace with --position 4--.

Column 7, Line 49 delete "PCT/EP20081056517," and replace with --PCT/EP2008/056517,--.

Column 7, Line 67 delete "1.2" and replace with --12--.

Column 8, Line 3 delete "with north" and replace with --with a north--.

Column 9, Line 54 delete "si Anal" and replace with --signal--.

Column 10, Line 32 delete "analog to digital" and replace with --analog-to-digital--.

Column 30, Line 36 delete "360$h$" and replace with --360$b$--.

Column 10, Line 49 delete "offset attenuation factors)" and replace with --of offset attenuation factors--.

Column 11, Line 40 delete "be" and replace with --be an--.

Column 12, Line 2 delete "circuit can" and replace with --circuit 324 can--.

Column 12, Line 6 delete "tempera=sensor 300" and replace with --temperature sensor 300--.

Column 12, Line 35 delete "can, perform" and replace with --can perform--.

Column 12, Line 48 delete "302of" and replace with --302 of--.

Column 12, Line 53 delete "of" and replace with --at--.

Column 12, Line 63 delete "vertical a Hall" and replace with --vertical Hall--.

Column 13, Line 22 delete "Hal" and replace with --Hall--.

Column 13, Line 47 delete "vertical. Hall" and replace with --vertical Hall--.

Column 13, Lines 55 to 56 delete "contact 402a first (and" and replace with --contact 402a (and--.

Column 13, Line 63 delete "Ball" and replace with --Hall--.

Column 14, Line 52 delete "lumber" and replace with --number--.

Column 14, Line 63 delete ", 503." and replace with --, 508.--.

Column 15, Line 2 delete "104" and replace with --304--.

Column 15, Line 31 delete "variety factors" and replace with --variety of factors--.

Column 16, Line 1 delete "MT" and replace with --CVH--.

Column 16, Line 10 delete "is" and replace with --and is--.

Column 16, Line 11 delete "A-e" and replace with --a-e--.

Column 16, Line 28 delete "vertical. Hall" and replace with --vertical Hall--.

Column 16, Line 32 delete "the" and replace with --to--.

Column 16, Line 45 delete "is" and replace with --are--.

Column 18, Line 4 delete "that CVH" and replace with --that a CVH--.

Column 18, Line 7 delete ", although CVH" and replace with --, although the CVH--.

Column 18, Line 30 delete "si" and replace with --signal--.

Column 18, Line 44 delete "to a block" and replace with --to block--.

Column 19, Line 5 delete "832, 834, and 834" and replace with --832, 834 and 836--.

Column 19, Line 52 delete "to a block" and replace with --to block--.

Column 19, Lines 55 to 56 delete "to a block" and replace with --to block--.

Column 19, Line 61 delete "vertical. Hall" and replace with --vertical Hall--.

Column 20, Line 15 delete "search, algorithm" and replace with --search algorithm--.

Column 20, Line 56 delete "output the" and replace with --output of the--.

Column 21, Line 25 delete "in" and replace with --is--.

CERTIFICATE OF CORRECTION (continued)
U.S. Pat. No. 9,638,766 B2

Column 21, Line 25 delete ", on" and replace with --, one--.

Column 21, Line 43 delete "gait" and replace with --gain--.

Column 21, Line 47 delete "take" and replace with --takes--.

Column 22, Line 20 delete "coupled an" and replace with --coupled to an--.

Column 22, Line 42 delete "determined. In" and replace with --determined in--.

Column 22, Line 46 delete "signal. 936$a$" and replace with --signal 936$a$--.

Column 23, Line 15 delete "signal)" and replace with --signals)--.

Column 23, Line 21 delete "si al" and replace with --signal--.

Column 23, Line 38 delete "of;" and replace with --of,--.

Column 23, Line 46 delete "such embodiment," and replace with --such an embodiment,--.

Column 23, Line 56 delete "such embodiment," and replace with --such an embodiment,--.

Column 23, Line 59 delete "such embodiment" and replace with --such an embodiment,--.

Column 24, Lines 41 to 42 delete "FIGS. 9" and replace with --FIG. 9--.

Column 24, Line 46 delete "FIG. 10. FIG. 10" and replace with --FIG. 10, FIG. 10--.

Column 24, Line 61 delete "CVH" and replace with --CVH sensing element--.

Column 25, Line 1 delete "am-attenuated" and replace with --un-attenuated--.

Column 25, Lines 12 to 13 delete "either to be too" and replace with --either too--.

Column 25, Line 25 delete "un attenuated" and replace with --un-attenuated--.

Column 25, Line 33 delete "1036, 1036," and replace with --1034, 1036,--.

Column 25, Line 53 delete "1036, 1036," and replace with --1034, 1036,--.

Column 25, Line 67 delete "CVH" and replace with --CVH sensing element--.

Column 26, Line 49 delete "signals 308$b$," and replace with --signals (e.g., 308$b$,--.

Column 26, Lines 66 to 67 delete "element) x/($U1$" and replace with --element x ($U1$--.

CERTIFICATE OF CORRECTION (continued)
U.S. Pat. No. 9,638,766 B2

Column 27, Line 27 delete "×(545+5.5))," and replace with --(5/(5-(-5.5)),--.

Column 27, Line 49 delete "sonic" and replace with --some--.

Column 28, Line 25 delete "then is determined" and replace with --then determined--.

Column 28, Line 39 delete "vertical. Hall" and replace with --vertical Hall--.

Column 28, Line 48 delete "appreciated the" and replace with --appreciated that the--.

Column 28, Line 54 delete "si at" and replace with --signal--.

Column 29, Line 27 delete "that that" and replace with --that--.

Column 29, Line 32 delete "above described" and replace with --above-described--.

Column 29, Line 36 delete "crossing vertical" and replace with --crossing (i.e., vertical--.

Column 29, Line 67 delete "that that" and replace with --that--.